United States Patent
Takaki et al.

(10) Patent No.: US 9,015,770 B2
(45) Date of Patent: Apr. 21, 2015

(54) DIGITAL BROADCASTING RECEPTION APPARATUS AND DIGITAL BROADCASTING RECEPTION METHOD

(71) Applicants: Kazuya Takaki, Tokyo (JP); Keiichi Shirasuka, Tokyo (JP)

(72) Inventors: Kazuya Takaki, Tokyo (JP); Keiichi Shirasuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/378,611

(22) PCT Filed: Oct. 1, 2012

(86) PCT No.: PCT/JP2012/075317
§ 371 (c)(1),
(2) Date: Aug. 13, 2014

(87) PCT Pub. No.: WO2013/157159
PCT Pub. Date: Oct. 24, 2013

(65) Prior Publication Data
US 2015/0020140 A1    Jan. 15, 2015

(30) Foreign Application Priority Data
Apr. 18, 2012  (JP) .................................. 2012-094569

(51) Int. Cl.
*H04N 7/16*    (2011.01)
*H04N 21/438*  (2011.01)
*H04H 60/42*   (2008.01)
*H04H 60/51*   (2008.01)
(Continued)

(52) U.S. Cl.
CPC .......... *H04N 21/4383* (2013.01); *H04H 60/42* (2013.01); *H04H 60/51* (2013.01); *H04H 60/70* (2013.01); *H04N 5/44* (2013.01); *H03J 1/0058* (2013.01); *H03J 2200/12* (2013.01); *H04N 21/2385* (2013.01)

(58) Field of Classification Search
USPC ..................................... 725/62, 100, 116, 151
See application file for complete search history.

(56) References Cited

U.S. PATENT DOCUMENTS 6,181,921 B1 *  1/2001  Konisi et al. ............... 455/186.2
2008/0020702 A1 *  1/2008  Jendbro et al. ............... 455/3.01
(Continued)

FOREIGN PATENT DOCUMENTS

JP  3-127097 A  5/1991
JP  5-48984 A   2/1993
(Continued)

*Primary Examiner* — Mulugeta Mengesha
(74) *Attorney, Agent, or Firm* — Birch, Stewart, Kolasch & Birch, LLP

(57) ABSTRACT

A digital broadcasting reception apparatus (100) is provided with: a reception unit (111, 121) that receives a signal; a signal strength detection unit (112, 122) that detects the received strength of the received signal; a channel scan control unit (125) that detects receivable physical channels; an area map storage unit (129) that stores coverage area information indicating coverage areas; a current position detection unit (127) that detects the current position; a tuning control unit (118) that determines a distance threshold value on the basis of the received strength detected by the signal strength detection unit when the channel scan control unit (125) detects a physical channel and the current position, at which the detection was made, is not included within the coverage area of the detected physical channel; and an area map generating unit (128) that expands the coverage area on the basis of the determined distance threshold value.

18 Claims, 23 Drawing Sheets

(51) Int. Cl.
*H04H 60/70* (2008.01)
*H03J 1/00* (2006.01)
*H04N 21/2385* (2011.01)
*H04N 5/44* (2011.01)

(56) References Cited

U.S. PATENT DOCUMENTS

2012/0133840 A1   5/2012   Shirasuka et al.
2013/0135534 A1*  5/2013   Murakami et al. ............ 348/726

FOREIGN PATENT DOCUMENTS

| | | |
|---|---|---|
| JP | 5-250455 A | 9/1993 |
| JP | 8-65188 A | 3/1996 |
| JP | 2005-184219 A | 7/2005 |
| JP | 2005-295332 A | 10/2005 |
| JP | 2006-174208 A | 6/2006 |
| JP | 2006-186473 A | 7/2006 |
| JP | 2008-78875 A | 4/2008 |
| JP | 2011-61753 A | 3/2011 |
| WO | WO 2011/030475 A1 | 3/2011 |

* cited by examiner

FIG. 2

| | 140a | 140b | 140c | 140d COVERAGE AREA | | | | 140e | 140f |
|---|---|---|---|---|---|---|---|---|---|
| | PHYSICAL CHANNEL | TS NAME OR ENSEMBLE NAME | SERVICE NAME | | | | | RELAY STATION CHANNEL | AFFILIATED STATION CHANNEL |
| | 13ch | AAAA | DDD | $(x_{10}, y_{10})$ | $(x_{11}, y_{11})$ | ... | $(x_{1m}, y_{1m})$ | 20ch, 32ch | 25ch |
| | 14ch | BBBB | EEE | $(x_{20}, y_{20})$ | $(x_{21}, y_{21})$ | ... | $(x_{2n}, y_{2n})$ | 33ch | 40ch |
| | ... | ... | ... | $(x_{30}, y_{30})$ | $(x_{31}, y_{31})$ | ... | $(x_{3p}, y_{3p})$ | ... | ... |
| | 18ch | CCCC | FFF | $(x_{40}, y_{40})$ | $(x_{41}, y_{41})$ | ... | $(x_{4q}, y_{4q})$ | 28ch | 37ch |

| PHYSICAL CHANNEL | TS NAME OR ENSEMBLE NAME | SERVICE NAME | UNLINKED POINT LIST | | | |
|---|---|---|---|---|---|---|
| 141a | 141b | 141c | 141d | | | |
| 13ch | AAAA | DDD | $(x_{10}, y_{10})$ | $(x_{11}, y_{11})$ | ... | $(x_{1m}, y_{1m})$ |
| 14ch | BBBB | EEE | $(x_{20}, y_{20})$ $(x_{21}, y_{21})$ | $(x_{22}, y_{22})$ $(x_{24}, y_{24})$ | ... | $(x_{2n}, y_{2n})$ $(x_{2n+1}, y_{2n+1})$ |
| ... | ... | ... | $(x_{30}, y_{30})$ | $(x_{31}, y_{31})$ | ... | $(x_{3p}, y_{3p})$ |
| 18ch | CCCC | FFF | $(x_{40}, y_{40})$ $(x_{41}, y_{41})$ | $(x_{42}, y_{42})$ $(x_{43}, y_{43})$ | ... | $(x_{4q}, y_{4q})$ $(x_{4q+1}, y_{4q+1})$ |

141

DIGITAL BROADCASTING RECEPTION APPARATUS AND DIGITAL BROADCASTING RECEPTION METHOD

TECHNICAL FIELD

The present invention relates to a digital broadcasting reception apparatus and a digital broadcasting reception method.

BACKGROUND ART

When a digital broadcasting reception apparatus is moved outside the coverage area of a physical channel that was being received normally, it becomes unable to receive the broadcast signal on that physical channel. A physical channel here is defined as a single unit with a particular frequency bandwidth. For this reason, heretofore, digital broadcasting reception apparatus has been developed in which broadcast area maps showing the coverage areas of each physical channel can be generated in advance to enable automatic switching to some other receivable physical channel at the current position.

When it detects a new receivable position not included in the broadcast area map, a conventional digital broadcasting reception apparatus enlarges the broadcast area map to a maximal polygon including all of the positions included in the existing broadcast area map and the new position. For this reason, there is the problem that in some cases, such as when the existing broadcast area map and the new position are widely separated, the conventional digital broadcasting reception apparatus may add new positions at which it is not certain that station selection is actually possible to the broadcast area map. In particular, when the actual broadcast area map has an indented shape that cannot be approximated by a convex shape, the conventional digital broadcasting reception apparatus connects the two projecting vertices of the indentation with a line, thereby enlarging the broadcast area map by filling in the indentation. This creates the problem that the conventional digital broadcasting reception apparatus may incorporate indented areas where station selection is not actually possible into the broadcast area map.

Therefore, when the digital broadcasting reception apparatus described in Patent reference 1 detects that reception is not possible in a broadcast area map, it creates an unreceivable area map. In actually performing automatic station selection, the digital broadcasting reception apparatus described in Patent reference 1 refers to the unreceivable area map in conjunction with the broadcast area map in order to exclude the effect of unreceivable areas that have been unnecessarily included in the broadcast area map.

PRIOR ART REFERENCES

Patent References

Patent reference 1: JP 2011-61753 (publication)

SUMMARY OF THE INVENTION

Problems to be Solved by the Invention

The digital broadcasting reception apparatus described in Patent reference 1, however, cannot create this unreceivable area map except by performing channel scans and identifying positions at which reception is not possible while actually on the move. For this reason, when the unreceivable area map has not yet been created, the digital broadcasting reception apparatus described in Patent reference 1 may recognize false broadcast areas by referring to the broadcast area map. The digital broadcasting reception apparatus described in Patent reference 1 has been problematic in that false recognition results in the performance of extra station selections and searches, requiring lengthy time for automatic selection of a receivable broadcast station.

An object of the present invention is therefore to obtain a coverage area having fewer differences in shape from the actual broadcast area.

Means for Solving the Problem

A digital broadcasting reception apparatus according to an embodiment of the invention includes:

a reception unit for receiving a signal from a physical channel;

a signal strength detection unit for detecting a received strength of the signal received by the reception unit;

a channel scan control unit for detecting a physical channel on which a broadcast signal can be received by the reception unit;

an area map storage unit for storing three or more items of positional information indicating positions at which the broadcast signal can be received for each physical channel, thereby storing coverage area information indicating a coverage area bounded by the positions indicated by the positional information;

a current position detection unit for detecting a current position;

a tuning control unit for, when the channel scan control unit detects a physical channel on which the broadcast signal can be received by the reception unit, carrying out a process of determining whether or not the current position detected by the current position detection unit is included in the coverage area of the detected physical channel according to the coverage area information, and, when the detected current position is not included in the coverage area of the detected physical channel, carrying out a process of specifying a threshold value indicating a distance that increases as the received strength detected by the signal strength detection unit increases; and an area map generating unit for carrying out a process of selecting as linked positions, on a basis of the coverage area information, two positions among the positions included in the coverage area of the detected physical channel within a range of the distance indicated by the defined threshold value from the detected current position, and a process of enlarging the coverage area to lines linking the linked positions and the detected current position by adding positional information indicating the detected current position to the coverage area information of the detected physical channel.

Effects of the Invention

Some embodiments of the present invention enable a coverage area having fewer shape differences from the actual broadcast area to be obtained.

BRIEF DESCRIPTION OF THE DRAWINGS

FIG. 2 is schematic diagram showing exemplary broadcast area map information in the first embodiment.

FIG. 4 is a schematic diagram showing exemplary unlinked list information in the first embodiment.

MODE FOR CARRYING OUT THE INVENTION

First Embodiment

Figure 1:
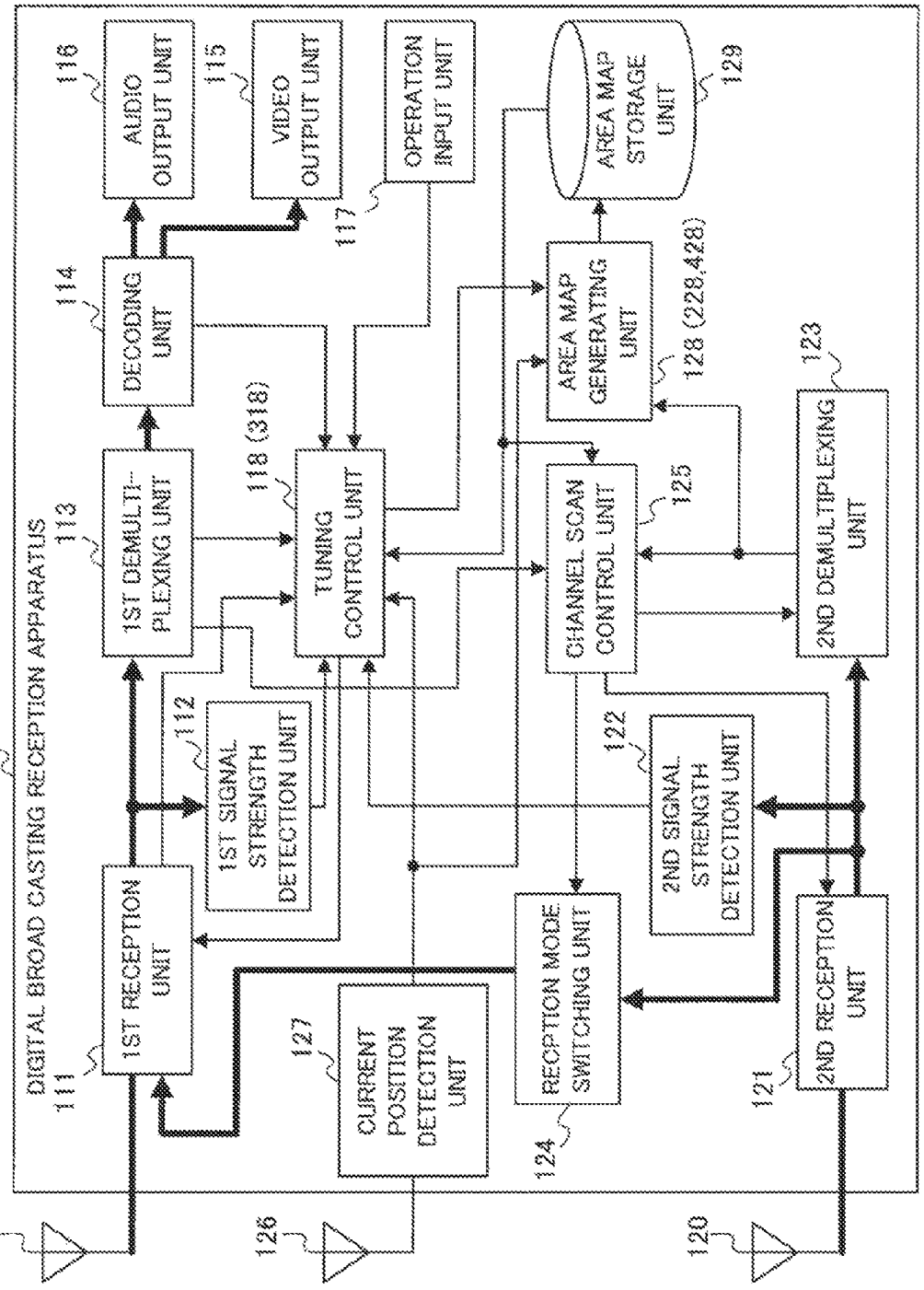
FIG. 1 is a block diagram schematically showing the configuration of the digital broadcasting reception apparatus according to first to fourth embodiments.

FIG. 1 is a block diagram schematically showing the configuration of the digital broadcasting reception apparatus 100 according to the first embodiment. The digital broadcasting reception apparatus 100 in the first embodiment includes a first antenna 110, a first reception unit 111, a first signal strength detection unit 112, a first demultiplexing unit 113, a decoding unit 114, a video output unit 115, an audio output unit 116, an operation input unit 117, and a tuning control unit 118. The digital broadcasting reception apparatus 100 in the first embodiment also includes a second antenna 120, a second reception unit 121, a second signal strength detection unit 122, a second demultiplexing unit 123, a reception mode switching unit 124, a channel scan control unit 125, a third antenna 126, a current position detection unit 127, an area map generating unit 128, and an area map storage unit 129. The first reception unit 111 and second reception unit 121 constitute a reception unit; the first signal strength detection unit 112 and second signal strength detection unit 122 constitute a signal strength detection unit; the first demultiplexing unit 113 and second demultiplexing unit 123 constitute a demultiplexing unit. The reference numbers in parentheses in FIG. 1 designate components in the second to fourth embodiments.

The first antenna 110 and the first reception unit 111 constitute a first broadcast reception section. The second antenna 120 and the second reception unit 121 constitute a second broadcast reception section. The section made up of the first antenna 110 and first reception unit 111 and the section made up of the second antenna 120 and the second reception unit 121 can operate independently of each other. In the digital broadcasting reception apparatus 100, the reception mode switching unit 124 switches between a single tuner mode and a double tuner mode.

The first antenna 110 generates a signal from a radio wave. The first antenna 110 supplies the generated signal to the first reception unit 111.

In the single tuner mode, the first reception unit 111 carries out station selection, demodulation, and error correction on the signal supplied from the first antenna 110 and generates a received signal, such as a TS (Transport Stream), for example. Then the first reception unit 111 performs diversity synthetic of the generated received signal and the received signal received via the second reception unit 121 and reception mode switching unit 124, thereby generating a single received signal of high stability. The first reception unit 111 supplies the received signal thus generated to the first demultiplexing unit 113. In the double tuner mode, the first reception unit 111 carries out station selection, demodulation, and error correction on the signal from the first antenna 110, thereby generates a received signal, and supplies this received signal to the first demultiplexing unit 113.

The first reception unit ill reports the C/N, the bit error rate, tuner PLL (Phase Locked Loop) lock information, and OFDM (Orthogonal Frequency Division Multiplication) frame lock information to the tuning control unit 118.

The first signal strength detection unit 112 detects the received strength of the signal received by the first reception unit 111, and reports the received strength to the tuning control unit 118.

The first demultiplexing unit 113 separates video data (e.g., video packets) and audio data (e.g., audio packets) from the signal supplied from the first reception unit 111. The first demultiplexing unit 113 supplies the separated audio and video data to the decoding unit 114.

The first demultiplexing unit 113 also reports loss of section data (e.g., PSI (Program Specific Information)/SI (Service Information) information, etc.) to the tuning control unit 118.

The decoding unit 114 decodes the audio and video data supplied from the first demultiplexing unit 113, thereby generating a video signal and an audio signal. The decoding unit 114 supplies the generated video signal to the video output unit 115 and the generated audio signal to the audio output unit 116.

The decoding unit 114 also reports decoding error rate information to the tuning control unit 118.

The video output unit 115 outputs a video picture based on the video signal supplied from the decoding unit 114. For example, the video output unit 115 may be configured as a display or the like. The video output unit 115 may also output graphics generated within the digital broadcasting reception apparatus 100 by superimposition on the video picture based on the video signal supplied from the decoding unit 114, although this is not indicated in the drawing.

The audio output unit 116 outputs sound based on the audio signal supplied from the decoding unit 114. For example, the audio output unit 116 may be configured as a speaker or the like.

The operation input unit 117 accepts input of operations from the user. Then the operation input unit 117 supplies operation information indicating the input operations to the tuning control unit 118.

The tuning control unit 118 performs overall control of the processing in the digital broadcasting reception apparatus 100. In particular, the tuning control unit 118 controls the process of selecting a physical channel. For example, the tuning control unit 118 decides whether or not the signal reception state has deteriorated according to reports from the first reception unit 111, first demultiplexing unit 113, and decoding unit 114. If the signal reception state has deteriorated, the tuning control unit 118 then accesses the area map storage unit 129 to search for a relay station, an affiliated station, or a broadcast station broadcasting with the same broadcast service name on a different physical channel, any of which is likely to being broadcasting the same program at the current position. If a broadcast service receivably broadcasting the same program is detected, the tuning control unit 118 reports this to the first reception unit 111 in order to switch the station selection automatically.

When the channel scan control unit 125 detects a physical channel with a receivable signal, the tuning control unit 118 decides whether or not the current position is included in the coverage area (described later) of the detected physical channel. If the current position is not included in the coverage area of the physical channel, then the tuning control unit 118 defines a threshold value representing a longer distance as the received strength detected by the second signal strength detection unit 122 increases. The tuning control unit 118 supplies this threshold value to the area map generating unit 128.

The second antenna 120 generates a signal from a radio wave. The second antenna 120 supplies the generated signal to the second reception unit 121.

The second reception unit 121 carries out station selection, demodulation, and error correction on the signal supplied from the second antenna 120, thereby generating a received signal. In the single tuner mode, the second reception unit 121 supplies the generated received signal to the first reception unit 111 through the reception mode switching unit 124. In the double tuner mode, the second reception unit 121 supplies the generated received signal to the second demultiplexing unit 123.

The second signal strength detection unit 122 detects the received strength of the signal received by the second reception unit 121 and reports the received strength to the tuning control unit 118.

The second demultiplexing unit 123 separates section data regarding the broadcast content from the received signal supplied from the second reception unit 121. The second demultiplexing unit 123 supplies the separated section data to the channel scan control unit 125 and area map generating unit 128.

The reception mode switching unit 124 switches between the double tuner mode, in which the received signals that have been respectively demodulated in the broadcast reception units of different sections (the first and second sections, here), and the single tuner mode, in which a single received signal with high received stability is output from the first reception unit 111 by combining received signals of a plurality of sections with diversity processing. The switching is performed when, by means of a switching control signal, the channel scan control unit 125 issues an instruction to switch over to the reception mode switching unit 124, or when the operation input unit 117 receives input of a mode switching instruction from the user.

The channel scan control unit 125 controls the second reception unit 121 and second demultiplexing unit 123 to execute a channel scan. In a channel scan, the second reception unit 121 sequentially selects physical channels, and the channel scan control unit 125 detects receivable physical channels: in other words, physical channels with receivable broadcast signals. When a receivable physical channel is detected, the channel scan control unit 125 sends the tuning control unit 118 channel information from which the detected physical channel, the broadcaster using the physical channel, and the service using the physical channel can be identified. A channel scan controlled by the channel scan control unit 125 is executed concurrently with station selection for program viewing by the first reception unit 111 without the viewer's awareness (executed in the background 'behind' the program being viewed), so it is also referred to as a 'background channel scan'. The term 'background channel scan' is used below only when there is a need to make a distinction; when there is no need to make a distinction from a normal type of channel scan, both will be referred to as a 'channel scan'.

The third antenna 126 is an antenna for detecting the current position: for example, a GPS antenna.

The current position detection unit 127 detects the current position from the signal from the third antenna 126. The current position detection unit 127 reports the detected current position to the tuning control unit 118 and area map generating unit 128.

The area map generating unit 128 generates broadcast area map information and unlinked list information on the basis of the section data received from the second demultiplexing unit 123 and the current position reported from the current position detection unit 127 and stores them in the area map storage unit 129.

The broadcast area map information includes coverage area information indicating receivable areas for each physical channel. When the reception state of the signal of the currently selected physical channel deteriorates as the digital broadcasting reception apparatus 100 moves around, the broadcast area map information is used to automatically switch over to a physical channel (another physical channel) with the same broadcast service.

The area map generating unit 128 executes a process that updates the broadcast area map information. For example, when the channel scan control unit 125 detects a physical channel with a receivable broadcast signal at the current position, if two positions included in a range extending from the current position to the distance indicated by the threshold value defined by the tuning control unit 118 can be selected from among the positions included in the coverage area of the detected physical channel, these positions are selected as linked positions. The area map generating unit 128 adds the positional information indicating the current position to the coverage area information of the detected physical channel, thereby enlarging the coverage area out to the lines connecting the selected linked positions with the current position.

The area map storage unit 129 stores the broadcast area map information and unlinked list information.

FIG. 2 is a schematic diagram showing exemplary broadcast area map information. The broadcast area map information 140 shown in FIG. 2 is in the form of a table that includes a physical channel column 140a, a TS name or ensemble name column 140b, a service name column 140c, a coverage area column 140d, a relay station channel column 140e, and an affiliated station channel column 140f.

The physical channel column 140a stores physical channel identification information for identifying physical channels. The physical channel identification information in the embodiment consists of physical channel numbers.

The TS name or ensemble name column 140b stores broadcaster identification information for identifying broadcasters. Here, in the digital broadcast standards such as the ISDB-T (Integrated Services Digital Broadcasting-Terrestrial), DVB-T (Digital Video Broadcasting-Terrestrial), DVB-H (Digital Video Broadcasting-Handheld), DTMB (Digital Terrestrial Multimedia Broadcast), and ATSC (Advanced Television Systems Committee), TS names are used as broadcaster identification information. In the digital broadcast standards such as the DAB (Digital Audio Broadcast), DAB+ (Digital Audio Broadcast plus), and DMB (Digital Multimedia Broadcasting), ensemble names are used as broadcaster identification information.

The service name column 140c stores service identification information for discriminating services provided by broadcasters. The embodiments use service names (organization channel names) as the service identification information.

Broadcast stations, which are the units of station selection, can be identified according to the information stored in the TS name or ensemble name column 140b and service name column 140c.

The coverage area column 140d stores coverage area information indicating coverage areas in which the broadcast signals broadcast on the physical channel identified in a physical channel column 140a, by a broadcaster identified in the TS name or ensemble name column 140b, and as a services identified in the service name column 140 can be received. Here, the coverage area information includes positional information indicating three or more positions at which the broadcast signal broadcast on a physical channel identified in the physical channel column 140a, by a broadcaster identified in the TS name or ensemble name column 140b, and as a service identified in the service name column 140c can be received. In the coverage area information here, the positional information is stored in a sequence that traces around the boundary of the coverage area in one direction. The positional information included in the coverage area information will be described in detail with reference to FIG. 3. A position indicated by the positional information included in the coverage area information will also be referred to below as a vertex.

The relay station channel column 140e stores relay station information indicating the physical channels of relay stations broadcasting the broadcast signals of the services identified in the service name column 140c, broadcast by the broadcasters identified in the TS name or ensemble name column 140b, on the physical channels identified in the physical channel column 140a.

The affiliated station channel column 140f stores affiliated station information indicating the physical channels of stations affiliated with the broadcasters identified in the TS name or ensemble name column 140b, who use the physical channels identified in the physical channel column 140a.

FIG. 2 shows an example in which a single TS or a single ensemble is sent with a single service name on each physical channel, but this example is not limiting. A plurality of TS's or ensembles may be sent with one or more service names. A single TS or ensemble may be sent with a plurality of service names. The broadcaster identification information is not limited to a TS name or an ensemble name. The service identification information is not limited to a service name. Furthermore, in the CMMB (China Mobile Multimedia Broadcasting) standard, for example, an MF (Multiplex Frame) may be used in place of a TS or an ensemble, and an MSF (Multiplex Sub Frame) may be used in place of a service.

As shown in FIG. 2, since the physical channels of relay stations and affiliated stations are acquired from the section data received by a channel scan and the information indicating these physical channels is stored in the broadcast area map information 140, the tuning control unit 118 can easily find an alternative physical channel likely to be broadcasting the same program when the signal reception state has deteriorated, and can complete automatic switching in a short time. Since a physical channel having the same broadcast service name is likely to be broadcasting the same program, it is preferable that the broadcast area map information 140 also stores the broadcast service name. The broadcast area map information 140 may also store other information that can be obtained from the broadcast signal.

Figure 3:
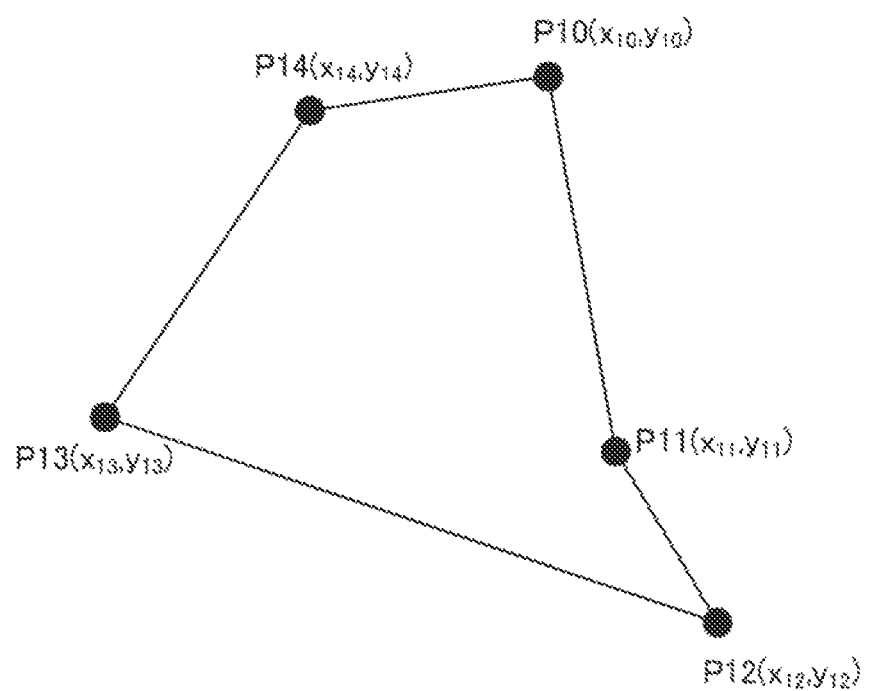
FIG. 3 is a schematic diagram illustrating positional information included in the coverage area information in the first embodiment.

FIG. 3 is a schematic diagram illustrating positional information included in the coverage area information of the broadcast area map information 140. In the embodiments, the coverage area has a polygonal shape.

In the example shown in FIG. 3, the coverage area defined by the coverage area information is the interior of the area indicated by the vertices $P10(x_{10}, y_{10})$, $P11(x_{11}, y_{11})$, $P12(x_{12}, y_{12})$, ..., $P_{1m}(x_{1m}, y_{1m})$.

The coverage area column 140d of the broadcast area map information 140 stores the positional information (coordinates) of the vertices in a sequence that follows the line segments (sides) connecting the vertices in one direction, such as in the clockwise direction. Here, the positional information is indicated in an orthogonal coordinate system in which the x coordinate axis indicates longitude and the y coordinate axis indicates latitude.

The sequence in which the positional information is stored in the coverage area column 140d is not limited to clockwise, but may be counterclockwise. As a method of selecting the first vertex to be stored in the coverage area column 140d, for example, the vertex with the smallest x-coordinate axis value, the vertex with the smallest y-coordinate axis value, or the vertex nearest to the 0 o'clock direction by analogy with a clock may be selected. Alternatively, some other method may be used to determine the first vertex.

Returning to the description of FIG. 1, the area map storage unit 129 stores unlinked list information including unlinked-position information in addition to the broadcast area map information 140.

The unlinked-position information is information indicating receivable positions outside the coverage areas, and is listed by physical channel.

FIG. 4 is a schematic diagram showing exemplary unlinked list information. The unlinked list information 141 shown in FIG. 4 is in the form of a table including a physical channel column 141a, a TS name or ensemble name column 141b, a service name column 141c, and an unlinked point list column 141d.

The physical channel column 141a stores physical channel identification information for identifying physical channels.

The TS name or ensemble name column 141b stores broadcaster identification information for identifying broadcasters.

The service name column 141c stores service identification information for identifying services provided by broadcasters.

The unlinked point list column 141d stores unlinked-position information, which is positional information for positions at which the broadcast signal broadcast on a physical channel defined by the physical channel column 141a, by a broadcaster defined in the TS name or ensemble name column 141b, and as a service defined in the service name column 141c can be received but which are not linked to (included in) the coverage area information in the broadcast area map information 140. A coverage area can be defined only when there are three or more linked positions, so positional information for pairs of linked positions and positional information for single unlinked positions are stored in the unlinked point list column 141d. A position indicated by the unlinked-position information stored in the unlinked point list column 141d is also referred to as an unlinked point.

Figure 5:
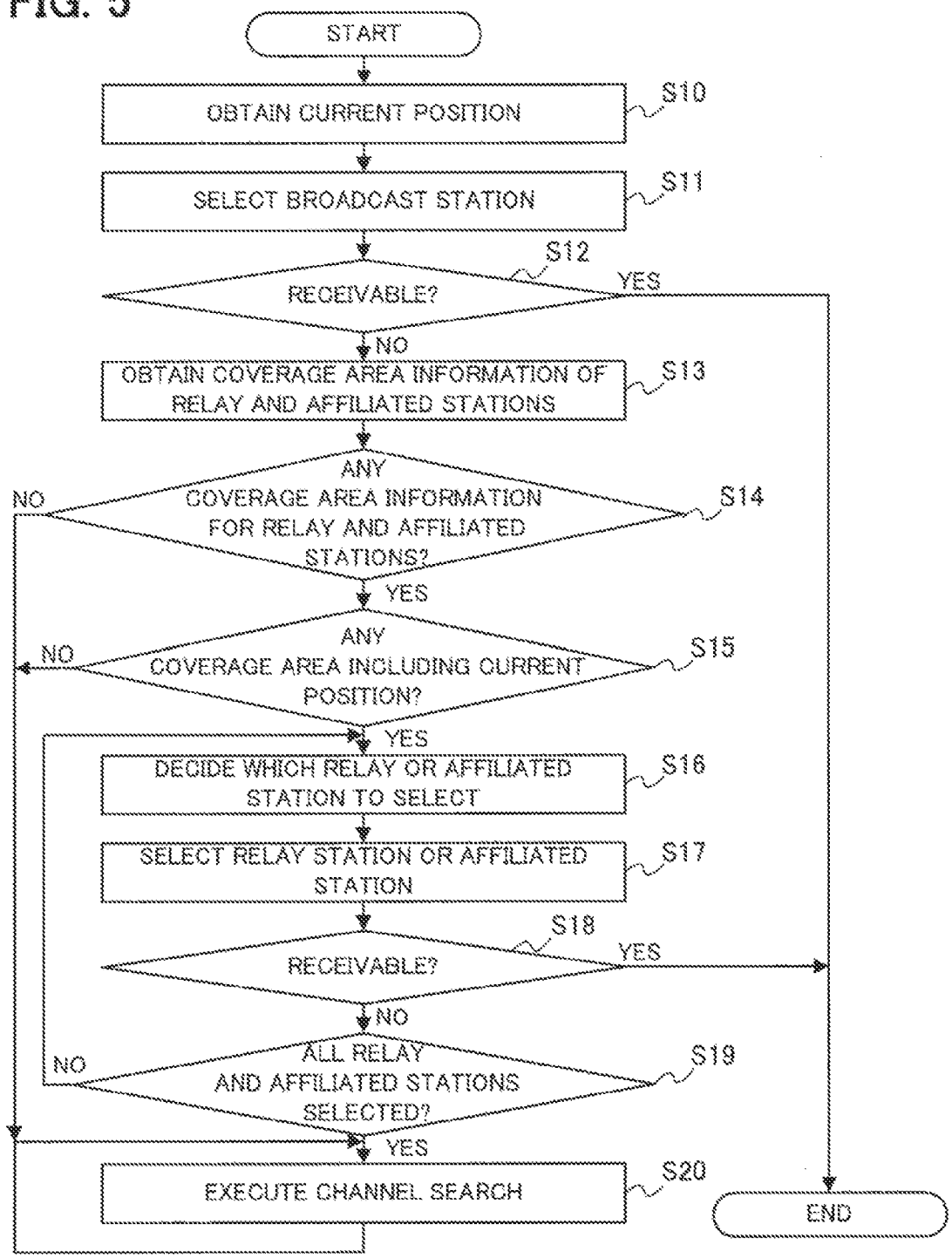
FIG. 5 is a flowchart illustrating the flow by which a station selection operation is processed in the digital broadcasting reception apparatus according to the first embodiment.

FIG. 5 is a flowchart illustrating the flow by which a station selection operation is processed in the digital broadcasting reception apparatus 100 in the first embodiment. The processing flow in the FIG. 5 starts when the operation input unit 117 receives input of a station selection instruction from the user.

First, the tuning control unit 118 obtains current position information indicating the current position from the current position detection unit 127 (S10). In actual practice here, the current position indicated by the current position information obtained in step S10 includes observational error due to antenna performance, so fraction digits may be discarded. Then, on instruction from the user, the tuning control unit 118 selects the desired broadcast station (S11).

Next, the tuning control unit 118 checks whether or not the desired broadcast station is receivable (S12). If it is receivable (Yes in S12), the tuning control unit 118 terminates the processing flow. In this case, the user can view the program of the designated broadcast station. If it is not receivable (No in S12), the tuning control unit 118 proceeds to step S13.

In step S13, the tuning control unit 118 retrieves the coverage area information of the relay stations and affiliated stations of the desired broadcast station from the broadcast area map information 140 stored in the area map storage unit 129.

Next, the tuning control unit 118 checks whether or not there is any coverage area information present for the relevant relay stations and affiliated stations (S14). The tuning control unit 118 then proceeds to step S20 if there is no such coverage area information (No in S14), or to step S15 if such coverage area information exists (Yes in S14).

In step S15, the tuning control unit 118 checks whether or not, in the coverage area information that it has retrieved, there is information for a coverage area including the current position indicated by the current position information obtained in step S10. The tuning control unit 118 then proceeds to step S20 if there is no such coverage area information (No in S15), and to step S16 if such coverage area information is present (Yes in S15). In actual practice, the coordinates of the current position include observational error due to antenna performance, so in step S15, instead of determining whether or not the current position is definitely inside a coverage area, the tuning control unit 118 may decide that the current position is inside in the coverage area even when it is outside the coverage area, provided the current position is within a prescribed distance range (e.g., several meters) around the coverage area.

In step S16, the tuning control unit 118 decides which broadcast station to select from among the relay stations and affiliated stations that have coverage areas including the current position. For example, the tuning control unit 118 decides to select the broadcast station that is most likely to be receivable among the relay stations and affiliated stations with coverage areas including the current position. Specifically, as the broadcast station to select, the tuning control unit 118 may choose the broadcast station with the shortest distance between the barycentric position of its coverage area and the current position, or the shortest distance between the boundary of its coverage area and the current position, as the broadcast station that is most likely to be receivable. The tuning control unit 118 may keep a history of broadcast stations to which switching was performed by automatic station selection (broadcast stations that were switched to successfully) in the area map storage unit 129, and select the broadcast station that has been switched to most frequently, or the broadcast station that has been switched to most recently, as the broadcast station that is most likely to be receivable. As the broadcast station that is most likely to be receivable, the tuning control unit 118 may also select the broadcast station with the highest received signal strength in a past channel scan or the broadcast station with the highest transmitting power as described in information included in the broadcast signal.

Next, the tuning control unit 118 selects the broadcast station decided on in step S16 (S17). The tuning control unit 118 checks whether or not the broadcast signal of this broadcast station is receivable (S18). If it is receivable (Yes in S18), the tuning control unit 118 terminates the processing flow. In this case, the user can view the program on the selected broadcast station. If it is not receivable (No in S18), the tuning control unit 118 proceeds to step S19.

In step S19, the tuning control unit 118 determines whether or not channel selection has been performed for all the relay stations and affiliated stations that have coverage areas including the current position. If it has performed channel selection for all these relay stations and affiliated stations (Yes in S19), the tuning control unit 118 proceeds to step S20. If it has not performed channel selection for all these relay stations and affiliated stations (No in S19), in other words, if broadcast stations for which channel selection has not been performed are included among the relay stations and affiliated stations that have coverage areas in which the current position is included, it proceeds to step S16. In step S16, the broadcast station to select is determined from among the broadcast stations for which selection has not been performed.

In step S20, the tuning control unit 118 executes a channel search in order to detect a viewable relay station or affiliated station at the current position. In step S20, to detect a relay station or affiliated station, the tuning control unit 118 selects the physical channels sequentially here, but physical channels that have already been selected in step S17 may be excluded from the channel search.

In the channel search in step S20, the tuning control unit 118 continues the search until it detects a relay station or an affiliated station viewable at the current position. If it cannot detect any relay station or affiliated station even after searching through all the physical channels, the tuning control unit 118 may resume the channel search from the beginning, or after reporting the absence of a broadcast station to the user, it may select an alternate broadcast station, such as a different service that is broadcast on the lowest numbered physical channel, or it may reselect the broadcast station that was being viewed until just before. Alternatively, after finishing the channel search, the tuning control unit 118 may wait for an operation from the user, without selecting any alternate broadcast station.

The channel search sequence in step S20 may be either the ascending or descending physical channel sequence. The tuning control unit 118 may also change the sequence such that all the relay stations and affiliated stations obtained in step S13 are searched preferentially. In regard to the selection sequence of relay stations and affiliated stations, the tuning control unit 118 may search in a prioritized sequence. The sequence may be prioritized by use of the positional relationships between the current position and the coverage areas of the relay or affiliated stations, such as the order of shortest distance between the nearest vertex of the coverage area and the current position, the order of shortest distance between the nearest side of the coverage area and the current position, the order of shortest distance between the barycentric position of the coverage area and the current position, or some other such order.

Figure 6:
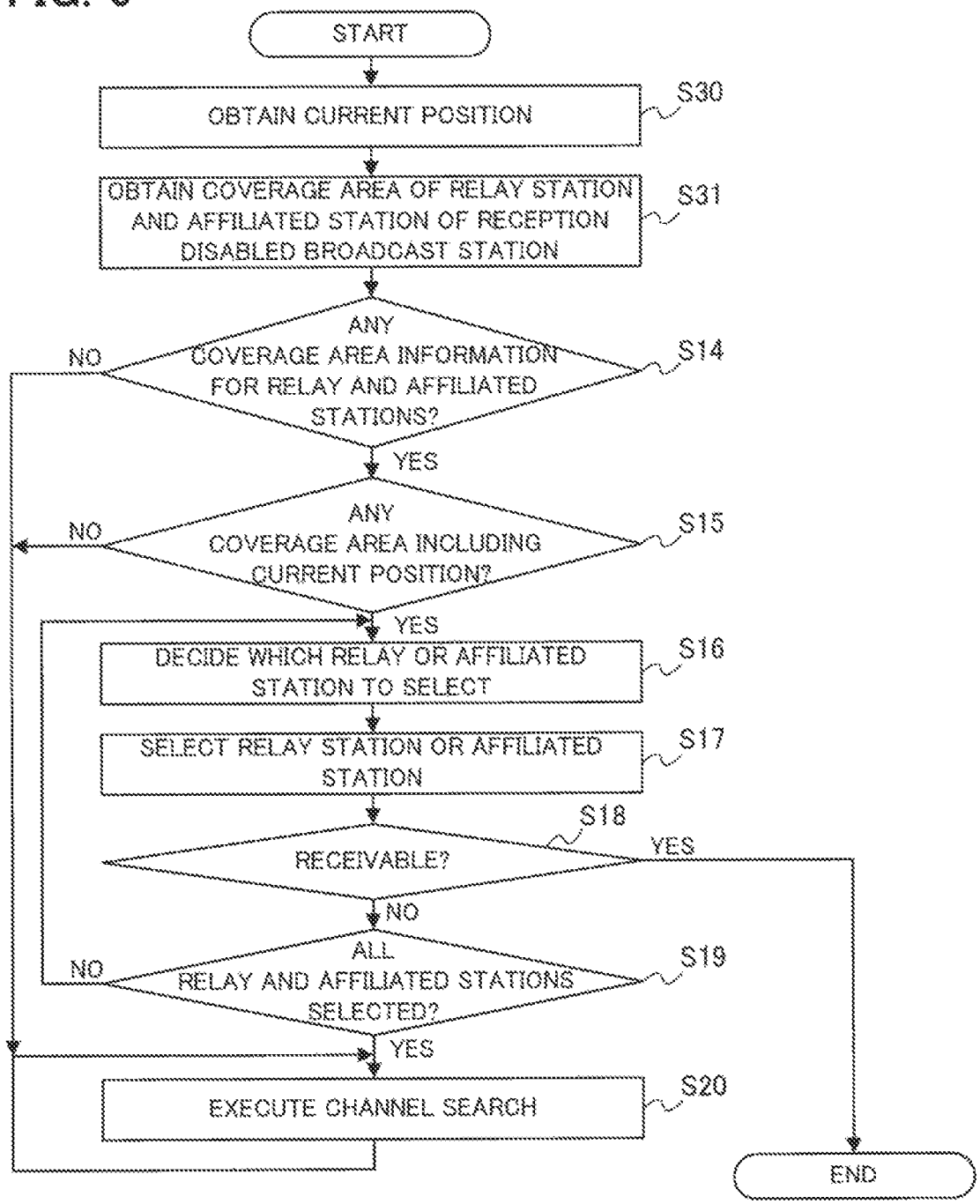
FIG. 6 is a flowchart illustrating the processing flow of automatic station selection when the reception state deteriorates in the digital broadcasting reception apparatus in the first embodiment.

FIG. 6 is a flowchart illustrating the flow of an automatic station selection process performed when the reception state deteriorates in the digital broadcasting reception apparatus 100 in the first embodiment. The flow in FIG. 6 starts when the tuning control unit 118 determines that the reception state has deteriorated according to the reports from the first reception unit 111, first demultiplexing unit 113, and decoding unit 114.

First, the tuning control unit 118 obtains current position information indicating the current position from the current position detection unit 127 (S30).

Next, from the broadcast area map information 140 stored in the area map storage unit 129, the tuning control unit 118 obtains coverage area information for relay stations and affiliated stations of the broadcast station the reception state of which was determined to have deteriorated (S31). The tuning control unit 118 then proceeds to step S14.

The processes in steps S14 to S20 in FIG. 6 are the same as the processes in steps S14 to S20 in FIG. 5. These processes enable the tuning control unit 118 to detect a relay station or an affiliated station that is alternatively receivable at the current position and continue reception.

The processing for automatic station selection when the reception state has deteriorated is executed when the reception state of the broadcast signal of the broadcast station currently being viewed deteriorates, but this is an example and not a limitation. For example, when it is detected, from the relationship between the coverage area corresponding to the broadcast station being viewed and the current position, that the current position is near the boundary of the coverage area and it is detected, from a current position history, that the direction of travel is headed out of the coverage area, the tuning control unit 118 may infer that reception of the broadcast station currently being viewed will soon become impossible, obtain the information about relay stations and affiliated stations from the area map storage unit 129, and perform automatic station selection.

Figure 7:
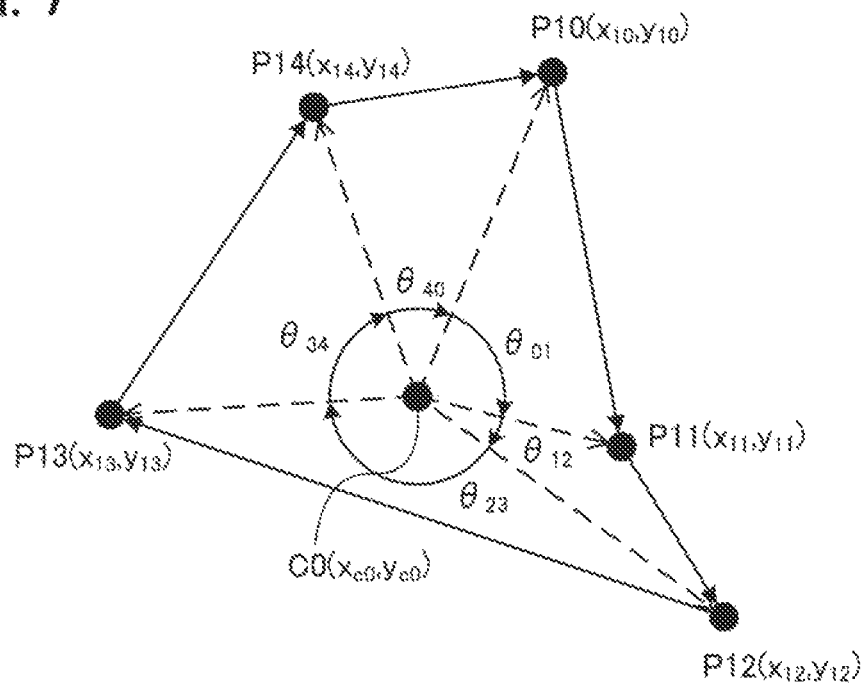
FIG. 7 is a diagram showing an exemplary positional relationship between the current position and the coverage area in the digital broadcasting reception apparatus in the first embodiment.

FIG. 7 is a diagram showing an exemplary positional relationship between the current position and the coverage area. A process for determining whether or not the current position is included in the coverage area in step S15 in FIG. 5 or 6 will be described with reference to FIG. 7.

First, the tuning control unit 118 determines the angles $\theta_{01}$, $\theta_{12}$, $\theta_{23}$, $\theta_{34}$, $\theta_{40}$ formed by the current position C0 of the digital broadcasting reception apparatus 100 and the vertices P10 to P14 constituting the coverage area. For example, when the current position of the digital broadcasting reception apparatus 100 is position C0, first the tuning control unit 118 defines five vectors extending from position C0 to the vertices P10 to P14 of the coverage area. Next, among these vectors, the tuning control unit 118 calculates the inner and outer products of, for example, the vector connecting the current position C0 and vertex P10 and the vector connecting the current position C0 and vertex P11, and calculates a tangent, sine, or cosine from these values, thereby determining the value of the angle formed by the vectors, e.g., the angle $\theta_{01}$ formed by vertex P10, the current position C0, and vertex P11. The tuning control unit 118 similarly calculates angles $\theta_{12}, \theta_{23}, \theta_{34}$, and $\theta_{40}$. The tuning control unit 118 then adds up all the calculated angles $\theta_{01}$, $\theta_{12}$, $\theta_{23}$, $\theta_{34}$, and $\theta_{40}$, and from whether or not the resulting sum is 360 degrees, it determines whether or not the current position C0 is within the coverage area.

More specifically, the tuning control unit 118 calculates the values of the inner product IV11 and outer product CV11 of the vector connecting the current position C0 and vertex P10 and the vector connecting the current position C0 and vertex P11 according to the following equation (1).

[Mathematical expression 1]

$$IV11 = (x_{10} - x_{c0}) \times (y_{10} - y_{c0}) + (x_{11} - x_{c0}) \times (y_{11} - y_{c0}) \quad (1)$$

[Mathematical expression 2]

$$CV11 = (x_{10} - x_{c0}) \times (y_{10} - y_{c0}) - (x_{11} - x_{c0}) \times (y_{11} - y_{c0}) \quad (2)$$

The tuning control unit 118 further determines the tangent TAN 11 from the following equation (3).

[Mathematical expression 3]

$$TAN11 = \frac{IV11}{CV11} \quad (3)$$

The tuning control unit 118 also calculates the length L010 from the current position C0 and vertex P100 and the length L011 from the current position C0 and vertex P11. The tuning control unit 118 can determine the sine SIN 11 from the following equation (4) and the cosine COS 11 from the following equation (5).

[Mathematical expression 4]

$$SIN11 = \frac{IV11}{L010 \times L011} \quad (4)$$

[Mathematical expression 5]

$$COS11 = \frac{CV11}{L010 \times L011} \quad (5)$$

By using the inverse function of any one of the tangent TAN 11, sine SIN 11, and cosine COS 11 that are determined as described above, the tuning control unit 118 can determine two angles in the range from 0 to 360 degrees. From the signs of the inner product IV11 and outer product CV11, the tuning control unit 118 can narrow the two determined angles down to a single angle by determine in which range the angles fall: the range from 0 to 90 degrees (if both are positive), from 90 to 180 degrees (if the outer product is negative), from 180 to 270 degrees (if both are negative), or from 270 to 360 degrees (if the inner product is negative). Alternatively, by using the inverse functions of at least two of the tangent TAN 11, sine SIN 11, and cosine COS 11, the tuning control unit 118 may determine two angles each in the range of 0 to 360 degrees, and then narrow them down to the single duplicated angle. This narrowed-down angle is $\theta_{01}$. Other angles can be calculated in the same way. After determining the angles $\theta_{01}$, $\theta_{12}$, $\theta_{23}$, $\theta_{34}$, $\theta_{40}$ between vertices P10, P11, P12, P13, and P14 at the current position C0, and adding all of them up, it can determine, from whether or not the calculated result is 360 degrees, whether or not the current position is within the coverage area.

Figure 8:
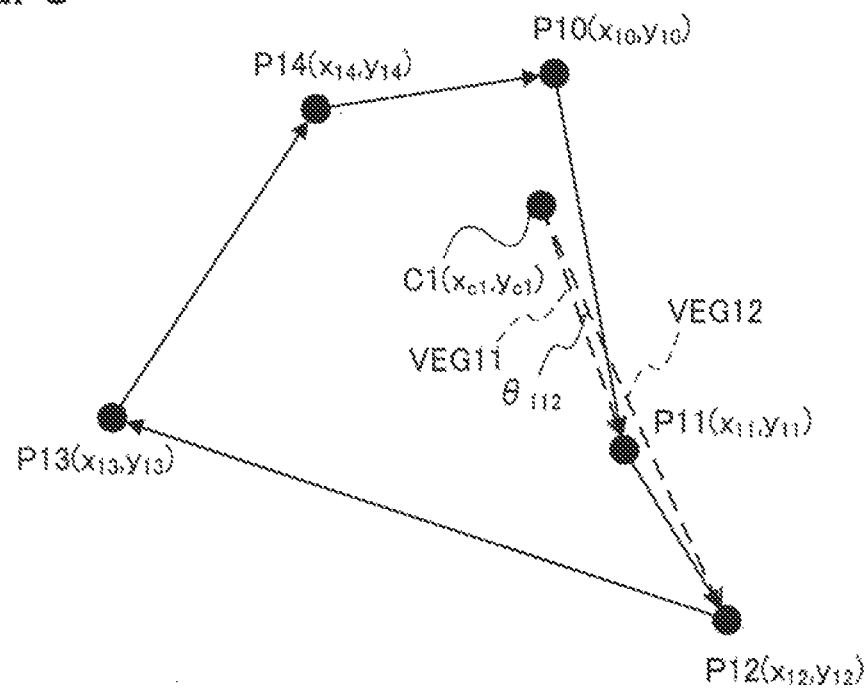
FIG. 8 is a schematic diagram showing an exemplary process for determining whether or not the current position is included in a coverage area in the first embodiment.

When the sequence of positional information of the vertices stored in the coverage area information makes the line segments between the current position C0 and vertices P10, P11, P12, P13, and P14 follow each other in just one direction (clockwise) as shown in FIG. 7, it is only necessary to add up the angles between the segments. When the segment between the current position C1 and vertex P12 is placed counterclockwise from the segment between the current position C1 and vertex P11 as shown in FIG. 8, however, the tuning control unit 118 must treat the angle $\theta_{112}$ between them as a negative value when adding it to the remaining angles. The tuning control unit 118 then determines whether or not the calculated result is 360 degrees.

Figure 9:
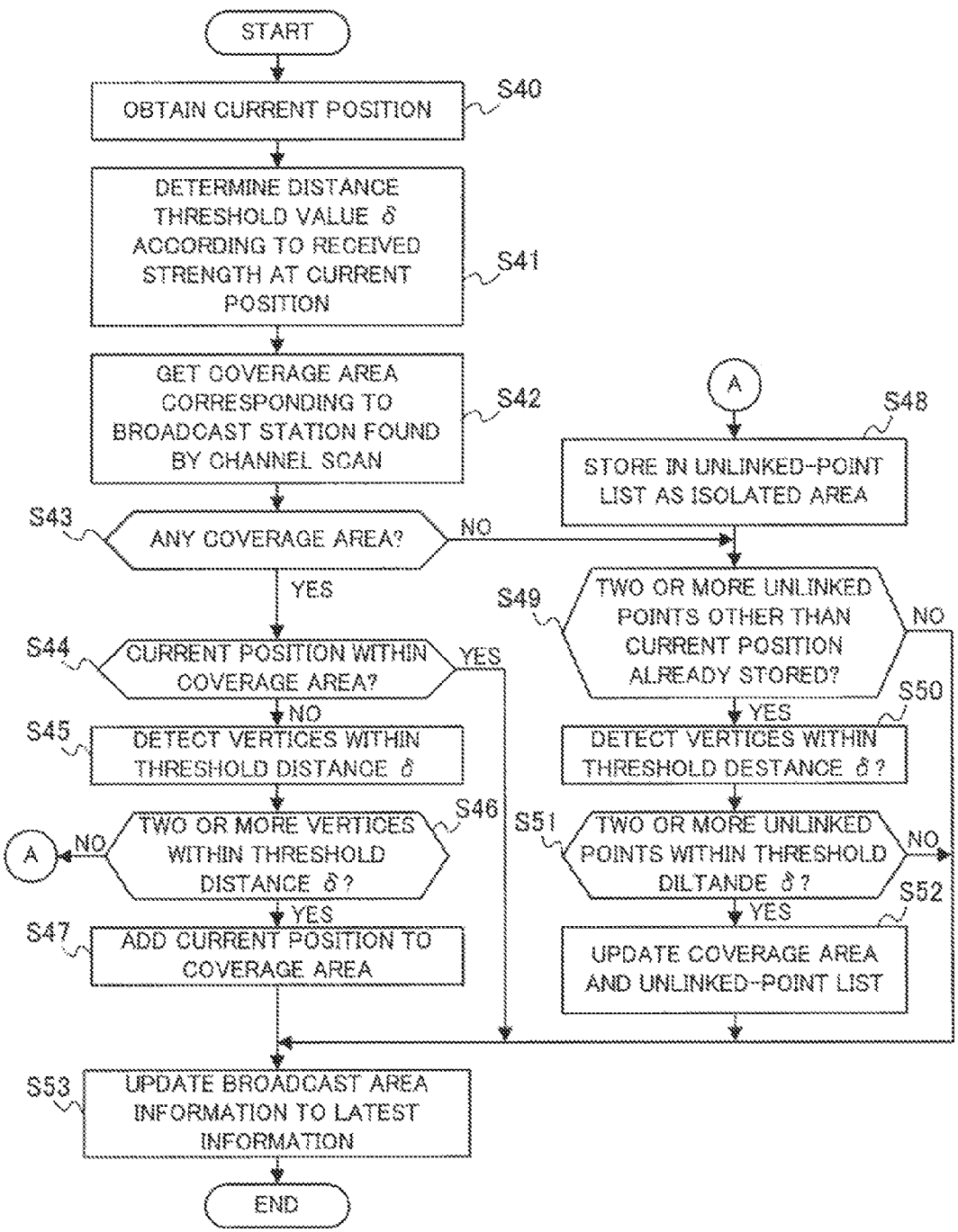
FIG. 9 is a flowchart illustrating a flow of processing for creating coverage area information by a channel scan in the digital broadcasting reception apparatus in the first embodiment.

FIG. 9 is a flowchart illustrating the flow of processing for creating coverage area information by a channel scan in the digital broadcasting reception apparatus 100 in the first embodiment. The channel scan control unit 125 controls the second reception unit 121 and second demultiplexing unit 123 to execute a channel scan independently of and concurrently with station selection for program viewing by the first reception unit 111. Here, the process of updating the coverage area information on the basis of a broadcast station found in the course of a channel scan will be described. The processing flow in FIG. 9 starts when a receivable broadcast station is found.

First, the tuning control unit 118 obtains the current position from the current position detection unit 127 (S40). Next, the tuning control unit 118 obtains the received strength of the signal from the second signal strength detection unit 122 and determines a distance threshold value δ according to the received strength of the signal (S41). The threshold value δ may be determined by classifying the received strength into several levels in advance and determining a specific value for each level, or in some other way. It is desirable for the threshold value δ to be set to a value that increases (indicating a longer distance) as the received strength of the signal increases.

Next, the tuning control unit 118 obtains coverage area information corresponding to the broadcast station that was found by the channel scan from the area map storage unit 129 (S42). The tuning control unit 118 decides whether or not corresponding coverage area information is found (S43). The tuning control unit 118 proceeds to step S44 if corresponding coverage area information is found (Yes in S43), and to step S49 if corresponding coverage area information is not found (No in S43).

In step S44, the tuning control unit 118 determines whether or not the current position obtained in step S40 is within the coverage area indicated by the coverage area information obtained in step S42. If the current position is within the coverage area (Yes in S44), the tuning control unit 118 proceeds to step S53; if the current position is not within the coverage area (No in S44), it proceeds to step S45.

In step S45, from among vertices at positions indicated by the positional information included in the coverage area information retrieved in step S42, the area map generating unit 128 detects vertices located at distances from the current position that are equal to or less than the threshold value δ determined in step S41 (S45). For example, the area map generating unit 128 may detect vertices included in the circle of radius δ centered at the current position. The area map generating unit 128 then decides whether or not there are two or more such vertices (S46), proceeds to step S47 if there are two or more such vertices (Yes in S46), and proceeds to step S48 if there are fewer than two such vertices (No in S46).

In step S47, the area map generating unit 128 adds the positional information indicating the current position detected in step S40 to the coverage area information. For example, the area map generating unit 128 sets the vertices detected in step S45 as linked points (linked positions). Next, the area map generating unit 128 sets the line segments connecting the current position and the linked points as new sides. Then the area map generating unit 128 constructs a polygon from these new sides and, among the sides that can be formed by the vertices included in the existing coverage area information, the side or sides that are included among the linked points, and generates a new coverage area by joining this polygon with the existing coverage area. If an existing vertex is now included in the interior of the new coverage area, the area map generating unit 128 deletes the positional information of that vertex from the coverage area information. In constructing the polygon, the area map generating unit 128 sequences its vertices in one direction, clockwise in the first embodiment, and when adding the current position to the coverage area information, it adds the positional information of the current position to the coverage area information in such a way as to preserve the sequence decided on for the polygon. The area map generating unit 128 then proceeds to step S53.

If there are fewer than two vertices with distances from the current position equal to or less than the threshold value δ determined in step S41 in step S46 (No in 846), the area map generating unit 128 proceeds to step S48.

In step S48, the current position obtained in step S40 is regarded as being included in a coverage area that is too isolated to be linked to the existing coverage area, the area map generating unit 128 stores the positional information indicating the current position in the unlinked point list column 141*d* in the unlinked list information 141 in association with the broadcast station detected by the channel scan. Then the area map generating unit 128 proceeds to step S49.

In step S49, the area map generating unit 128 whether two or more unlinked points (excluding the current position) are stored in the unlinked point list column 141d in the unlinked list information 141 in association with the broadcast station detected by the channel scan. If two or more unlinked points are stored (Yes in S49), the area map generating unit 128 proceeds to step S50; if fewer than two unlinked points are stored (No in S49), it proceeds to step S53.

In step S50, from among the unlinked points stored in the unlinked point list column 141d in association with the broadcast station detected by the channel scan, the area map generating unit 128 detects unlinked points (excluding the current position) with distances from the current position that are equal to or less than the threshold value δ determined in step S41. Then the tuning control unit 118 decides whether or not there are two or more such unlinked points (S51). If there are two or more such unlinked points (Yes in S51), the area map generating unit 128 proceeds to step S52; if there are fewer than two such vertices (No in S51), it proceeds to step S53.

In step S52, the area map generating unit 128 generates a new coverage area with the two or more unlinked points detected in step S51 and the current position obtained in step S40. In other words, the area map generating unit 128 stores positional information indicating these unlinked points and the current position in the broadcast area map information 140 in association with the broadcast station detected by the channel scan. The area map generating unit 128 also deletes the positional information indicating these unlinked points and the current position from the unlinked list information 141. When the newly generated coverage area touches or overlaps the existing coverage area, the area map generating unit 128 may combine the newly generated coverage area with the existing coverage area. In this case, it is desirable to combine the newly generated coverage area with the existing coverage area when, for example, a vertex of the newly generated coverage area is located on a side of or within the existing coverage area.

In step S53, the area map generating unit 128 updates the broadcast area map information 140 stored in the area map storage unit 129 to reflect the latest information detected by the channel scan. When an affiliated station or relay station is newly detected by the channel scan, for example, the area map generating unit 128 adds its physical channel to the broadcast area map information 140. If the broadcast area map information 140 includes information other than that shown in FIG. 2, the area map generating unit 128 also updates such information with the latest information detected by the channel scan.

Figure 10:
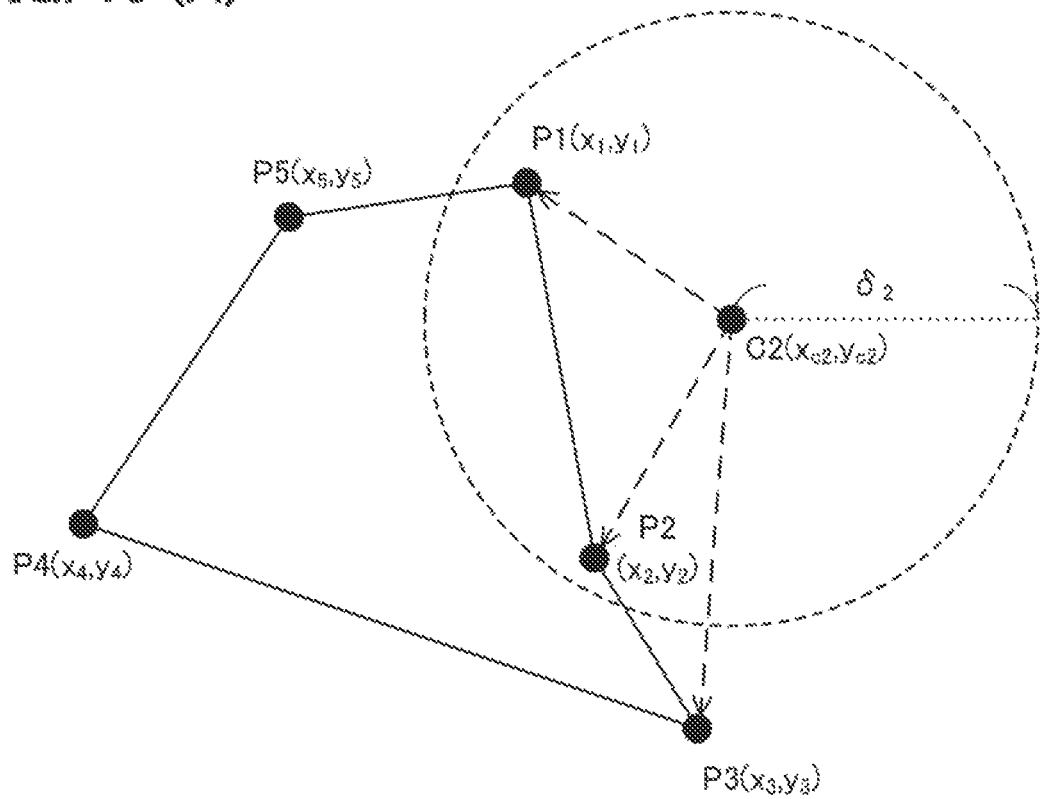
FIGS. 10(A) and 10(B) are first schematic diagrams illustrating the process of adding the current position to the coverage area information in the digital broadcasting reception apparatus in the first embodiment.
Figure 10:
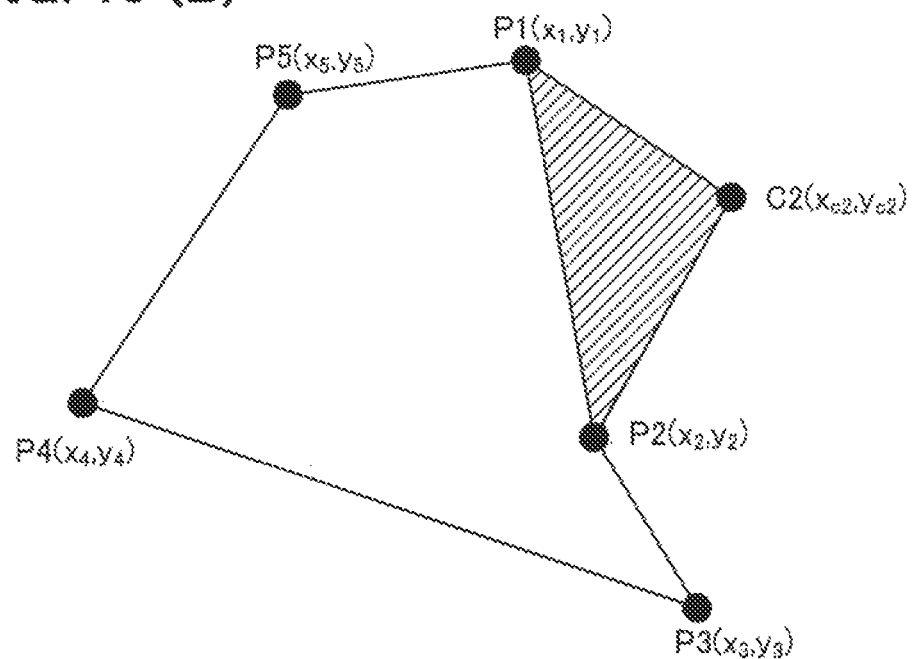
Figure 11:
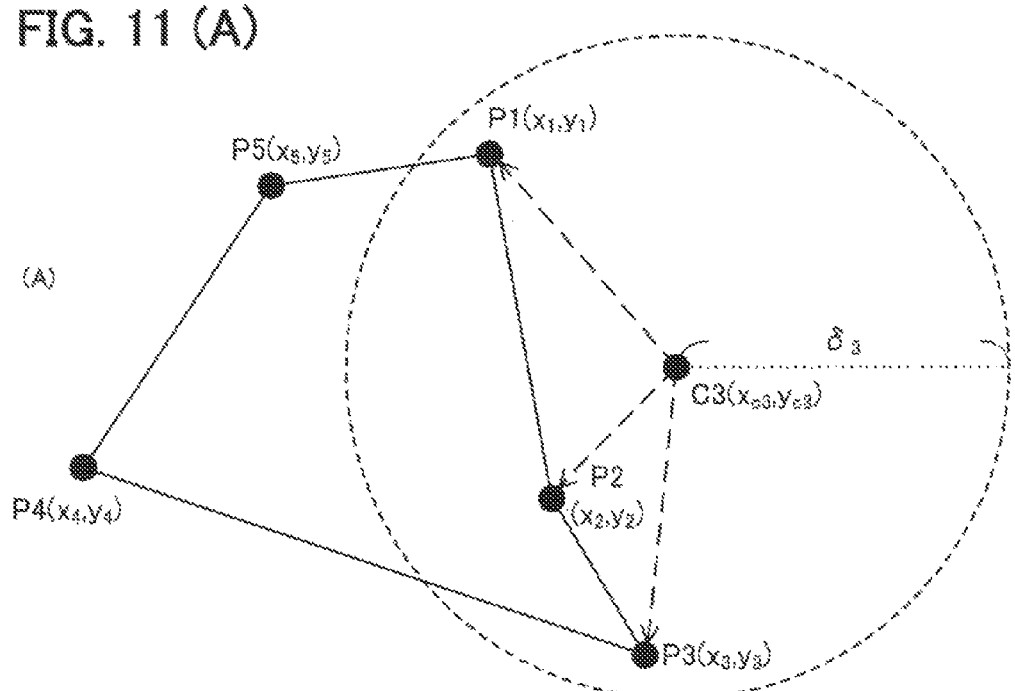
FIGS. 11(A) and 11(B) are second schematic diagrams illustrating the process of adding the current position to the coverage area information in the digital broadcasting reception apparatus in the first embodiment.
Figure 11:
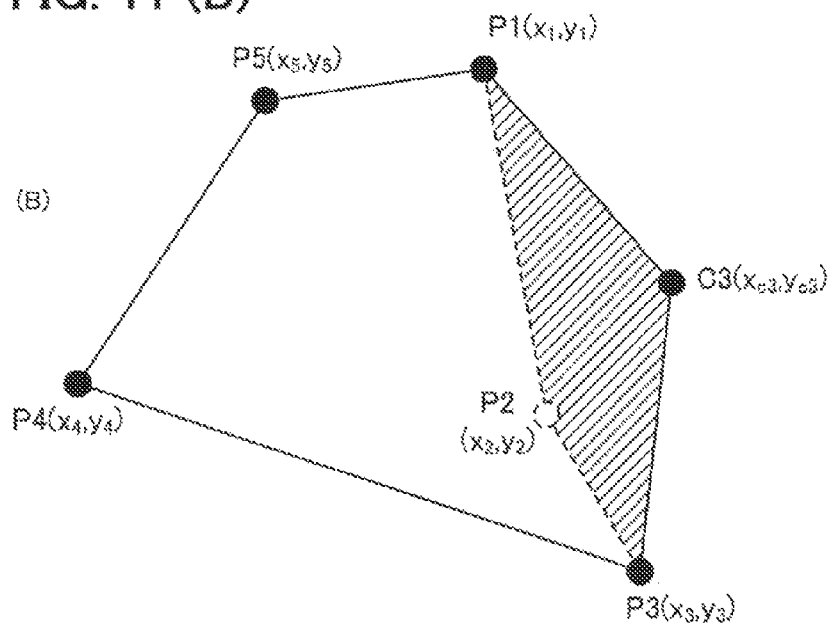
Figure 12:
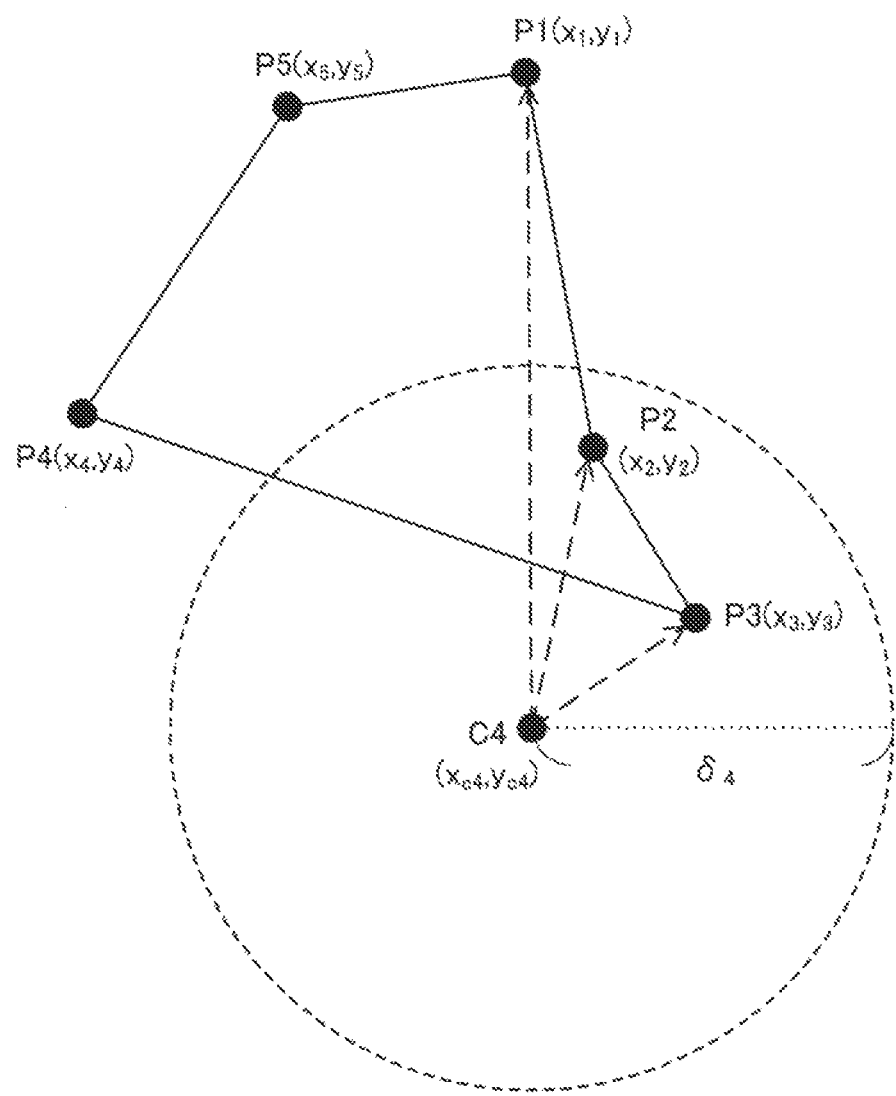
FIG. 12 is a third schematic diagram illustrating the process of adding the current position to the coverage area information in the digital broadcasting reception apparatus in the first embodiment.

FIGS. 10(A) and 10(B) are first schematic diagrams illustrating the process for adding the current position to the coverage area information in the digital broadcasting reception apparatus 100 in the first embodiment. FIGS. 11(A) and 11(B) are second schematic diagrams illustrating the process for adding the current position to the coverage area information in the digital broadcasting reception apparatus 100 in the first embodiment. FIG. 12 is a third diagram illustrating the process for adding the current position to the coverage area information in the digital broadcasting reception apparatus 100 in the first embodiment. The process in step S47 in FIG. 9 will be concretely described with reference to FIGS. 10(A), 10(B), 11(A), 11(B) and 12.

Referring first to FIGS. 10(A) and 10(B), suppose that vertices P1, P2, P3, P4, and P5 are stored in the coverage area information in this sequence, that the current position is position C2, and that the distance threshold value determined from the received strength of the signal received at the current position C2 is value $\delta_2$, as shown in FIG. 10(A). In this case, as shown in the drawing, vertices P1 and P2 are detected as existing vertices with distances from the current position C2 not exceeding the threshold value $\delta_2$.

The area map generating unit 128 determines that the triangle (the hatched area in FIG. 10(B)) formed by the line segments between the current position C2 and vertex P1, between the current position C2 and vertex P2, and between vertices P1 and P2 is a polygon to be combined with the existing coverage area. The area map generating unit 128 also defines the vertices of this polygon so that they follow the same direction, here the clockwise direction, as in the existing coverage area. For example, it will be assumed here that the vertices are defined in the sequence of vertex P1, followed by the current position C2, followed by vertex P2. The area map generating unit 128 adds the current position C2 to the coverage area information so as to maintain the sequence defined in the combined polygon. Here, for example, the current position C2 is added to the coverage area information so that the sequence becomes vertex P1, the current position C2, vertex P2, vertex P3, vertex P4, vertex P5.

Referring next to FIGS. 11(A) and 11(B), suppose that vertices P1, P2, P3, P4, and P5 are stored in the coverage area information in this sequence, that the current position is position C3, and that the distance threshold value determined from the received strength of the signal received at the current position C3 is value $\delta_3$, as shown in FIG. 11(A). In this case, as shown in the drawing, vertices P1, P2, and P3 are detected as existing vertices with distances from the current position C3 not exceeding the threshold value $\delta_3$.

The area map generating unit 128 determines that the polygon formed by any of the line segments between the current position C3 and vertex P1, between the current position C3 and vertex P2, between the current position C3 and vertex P3, between vertices P1 and P2, and between vertices P2 and P3 is a polygon to be combined with the existing coverage area. Here, for example, the angles formed by the line segments between the current position C3 and vertex P1, between the current position C3 and vertex P2, and between the current position C3 and vertex P3 are calculated, and the two line segments forming the greatest angle are selected as new sides of the polygon. The polygon formed by the line segments between the current position C3 and vertex P1, between the current position C3 and vertex P3, between vertices P1 and P2, and between vertices P2 and P3 (the hatched area in FIG. 11(B)) is thereby identified as the polygon to be combined with the existing coverage area. The area map generating unit 128 also defines the vertices of this polygon so that they follow the same direction, here the clockwise direction, as in the existing coverage area. For example, it will be assumed here that the vertices are defined in the sequence of vertex P1, followed by the current position C3, followed by vertex P3, followed by vertex P2. The area map generating unit 128 adds the current position C3 to the coverage area information so as to maintain the sequence defined in the combined polygon. Vertex P2 is now deleted because it is included in the interior of the new coverage area. Accordingly, when the current position C3 is added to the coverage area information here the sequence becomes vertex P1, the current position C3, vertex P3, vertex P4, vertex P5.

Here the line segment between vertices P1 and P2 and the line segment between vertices P2 and P3 are extracted as line segments defined by vertices P1 and P3 in the existing coverage area, but this example is not limiting. For example, the line segments between vertices P3 and P4, between vertices P4 and P5, and between vertices P5 and P1 could be extracted. In this case, the new coverage area is formed by vertex P1, the current position C3, vertex P3, vertex P4, and vertex P5, and includes the existing coverage area formed by vertices P1, P2, P3, P4, and P5, so the shape of the newly added area turns out again to be the hatched area shown in FIG. 10(B). Accordingly, this extraction strategy ends up deriving the same new coverage area.

Likewise, although here the line segments with the greatest angle between them are extracted in selecting new sides, this is not the only possible extraction method; the sides that maximize the area of the polygon to be newly added may be extracted, or some other method may be used.

Referring next to FIG. 12, suppose that vertices P1, P2, P3, P4, and P5 are stored in the coverage area information in this sequence, that the current position is position C4, and that the distance threshold value determined from the received strength of the signal received at the current position C4 is 64, as shown in FIG. 12. In this case, as shown in the drawing, vertices P2 and P3 are detected as existing vertices with distances from the current position C4 not exceeding the threshold value $\delta_4$.

As shown in FIG. 12, the polygon formed by the line segments between the current position C4 and vertex P2, between the current position C4 and vertex P3, and between vertices P2 and P3 includes a portion of the existing coverage area. In such cases, the area map generating unit 128 does not combine the polygon with the existing coverage area but stores it as a new coverage area in the broadcast area map information 140, separate from the existing coverage area.

In other words, in the first embodiment, when the newly defined polygon is in contact with the existing coverage area as shown in FIGS. 10(A), 10(B), 11(A), and 11(B), the area map generating unit 128 combines the polygon with the existing coverage area. When the newly defined polygon includes a portion of the existing coverage area as shown in FIG. 12, however, the area map generating unit 128 does not combine the polygon with the existing coverage area but makes it a new coverage area.

As described above, when a new receivable position is found outside the coverage area, the digital broadcasting reception apparatus 100 in the first embodiment determines a distance threshold value on the basis of the received signal strength, making it possible to integrate the new position into the existing coverage area only when a plurality of vertices of the existing coverage area are located within a distance range indicated by the threshold value. Therefore, when the coverage area is enlarged, it is enlarged by adding areas with strong received signal strength in large increments, and areas with weak received signal strength in small increments. As a result, areas with weak received signal strength are added a small amount at a time; in other words, areas with weak received signal strength are added to the coverage area with greater attention to detail. In particular, since the received strength of a receivable signal has the property of weakening near the boundary of the actual coverage area, a minimal or near-minimal distance threshold value is applied to receivable positions detected near the boundary of the actual coverage area, so the updating of the coverage area at these positions is also performed in minimal or near-minimal increments. Therefore, the coverage area can be updated in a way that follows the boundary of the actual coverage area, and in particular, even when the actual coverage area has an indented shape, this shape can be reproduced in the boundary of the coverage area in the digital broadcasting reception apparatus 100.

Since a coverage area with an indented shape can be reproduced in this way, if the reception state of the signal from the broadcast station being viewed deteriorates while the current position is included within the indentation and an instruction to select a broadcast station that is not receivable at the current position is received, it becomes possible to execute a channel search and tune to a broadcast station that is receivable at the current position without performing uncalled-for selection of relay and affiliated stations. In addition, the program viewing disabled period at such a current position can be shortened because a full channel search is initiated quickly.

The effect of the first embodiment described above will be described with reference to FIGS. 13 and 14.

Figure 13:
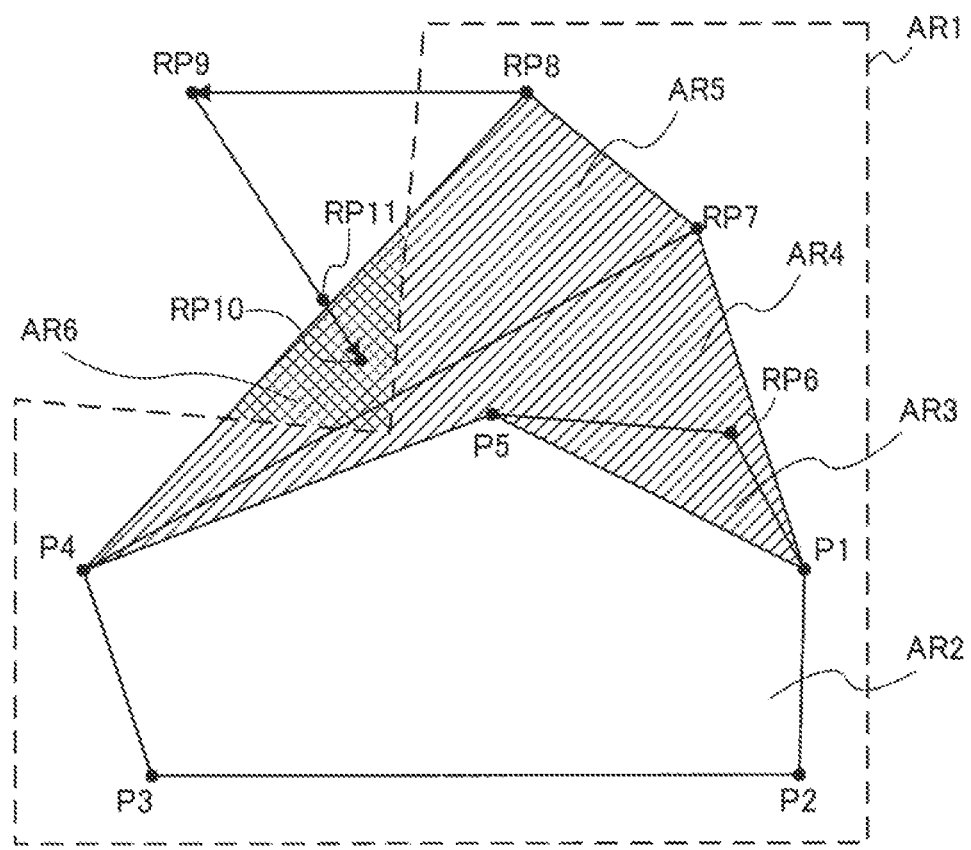
FIG. 13 is a schematic diagram illustrating exemplary prior art processing for the case in which a new receivable position not included in a coverage area is detected, and the coverage area is enlarged to a maximal polygon including both the existing coverage area and the new position.

FIG. 13 is a schematic diagram illustrating exemplary prior art processing for the case in which a new receivable position not included in a coverage area is detected, and the coverage area is enlarged to a maximal polygon including both the existing coverage area and the new position.

In FIG. 13 it is assumed that the area in which a broadcast signal from a certain broadcast station can actually be received is an L-shaped area AR1 (area bounded by the dotted line). A prior art digital broadcasting reception apparatus is assumed to have already stored the polygon AR2 represented by vertices P1 to P5 as a coverage area. If this digital broadcasting reception apparatus carries out a channel scan while moving from point P6 to point P7 and then to point P8, the result is that the coverage area AR2 is enlarged by linking areas AR3, AR4, and AR5 to it in this sequence. When point RP8 is reached, the coverage area assumes a shape into which the crosshatched area AR6 in FIG. 13 is linked. Despite being outside the actual coverage area AR1, area AR6 is now recognized by the digital broadcasting reception apparatus as an area in which reception is possible.

Figure 14:
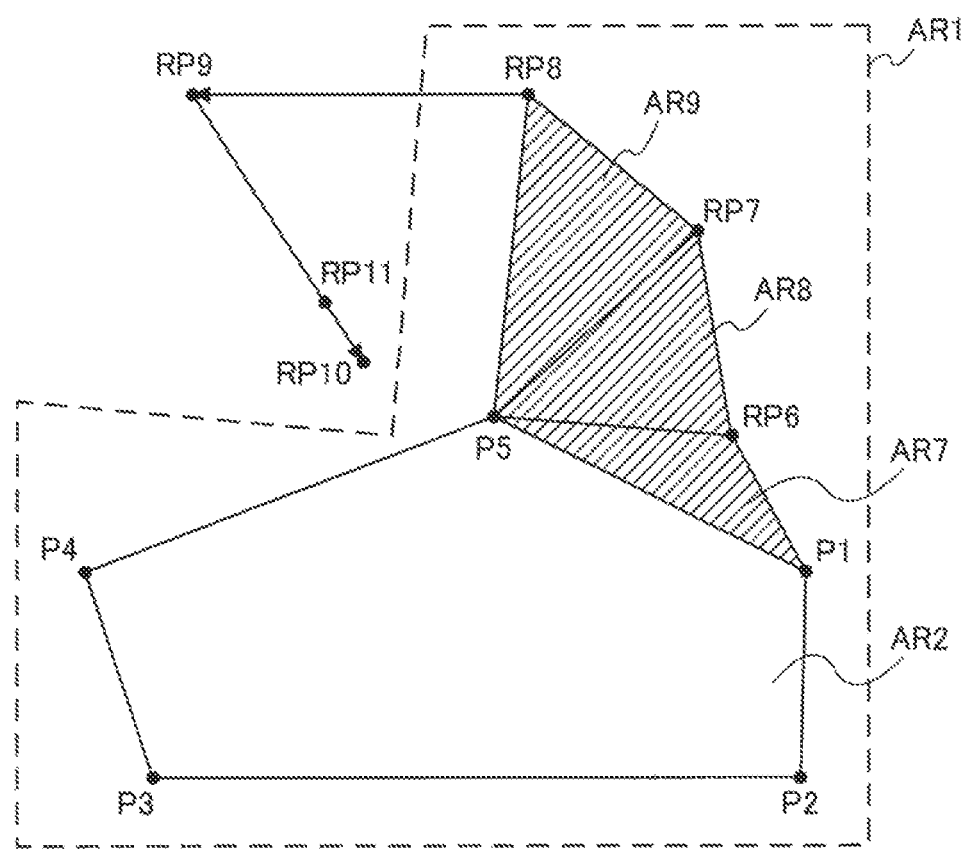
FIG. 14 is a schematic diagram illustrating an exemplary process for enlarging a coverage area in the digital broadcasting reception apparatus in the first embodiment.

FIG. 14 is a schematic diagram illustrating an exemplary process for enlarging the coverage area in the digital broadcasting reception apparatus 100 according to the first embodiment.

In FIG. 14, when the digital broadcasting reception apparatus 100 carries out a channel scan while moving in sequence from point RP6 to point RP7 and then to point RP8 under the same conditions as in FIG. 13, the result is that coverage area AR2 is successively enlarged by linking areas AR7, AR8, and AR9 in this sequence. Even when point RP8 is reached, the coverage area does not include any area outside the actual coverage area AR1. Therefore, when the digital broadcasting reception apparatus 100 passes through the indented section outside the actual coverage area AR1, for example, even when it moves from point RP8 to RP9 and then moves toward point P10, it does not select relay and affiliated stations on the basis of area AR6 shown in FIG. 13, but executes a channel search as soon as the reception state deteriorates, enabling quicker selection of a receivable broadcast station.

Second Embodiment

As shown in FIG. 1, the digital broadcasting reception apparatus 200 in the second embodiment includes a first antenna 110, a first reception unit 111, a first signal strength detection unit 112, a first demultiplexing unit 113, a decoding unit 114, a video output unit 115, an audio output unit 116, an operation input unit 117, and a tuning control unit 118. The digital broadcasting reception apparatus 200 in the second embodiment also includes a second antenna 120, a second reception unit 121, a second signal strength detection unit 122, a second demultiplexing unit 123, a reception mode switching unit 124, a channel scan control unit 125, a third antenna 126, a current position detection unit 127, an area map generating unit 228, and an area map storage unit 129. The digital broadcasting reception apparatus 200 in the second embodiment differs from the digital broadcasting reception apparatus 100 in the first embodiment in the processing in the area map generating unit 228.

The area map generating unit 228 in the second embodiment performs substantially the same processing as the area map generating unit 128 in the first embodiment, but differs in regard to the process of adding the current position to a coverage area, and when the coverage area has an indentation, further differs by performing a process that divides the coverage area so as to eliminate the indentation.

Figure 15:
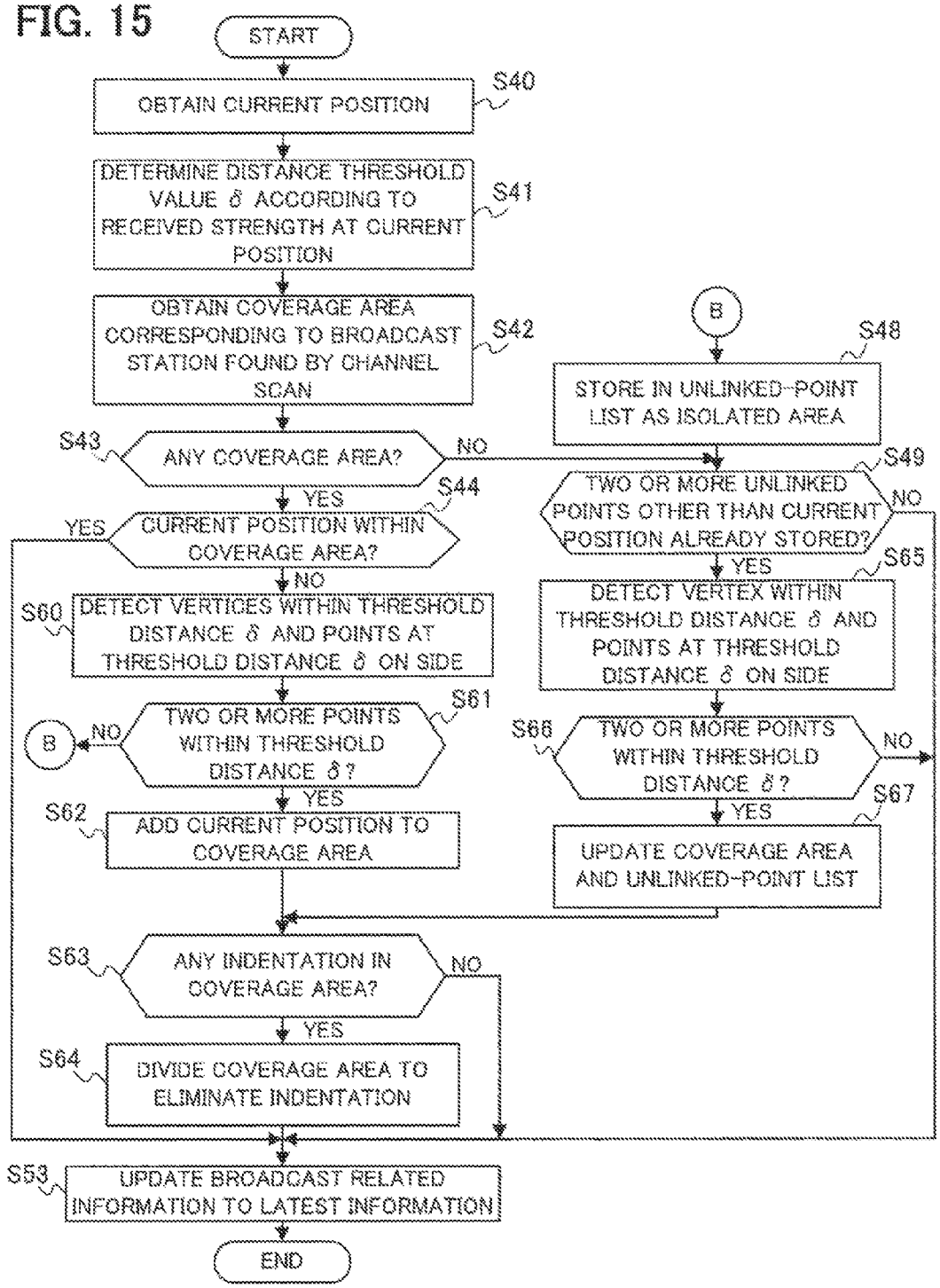
FIG. 15 is a flowchart illustrating a flow of processing for creating coverage area information by a channel scan in the digital broadcasting reception apparatus in the first embodiment.

FIG. 15 is a flowchart illustrating the flow of processing for creating coverage area information by a channel scan in the digital broadcasting reception apparatus 200 in the second embodiment. Steps in FIG. 15 that perform the same processing as in FIG. 9 have the same reference characters as in FIG. 9. In FIG. 15, as in FIG. 9, the channel scan control unit 125 controls the second reception unit 121 and second demultiplexing unit 123 to execute a channel scan independently of and concurrently with station selection for program viewing by the first reception unit 111. The processing flow in FIG. 15 starts when a receivable broadcast station is found.

The processing in steps S40 to S44 in FIG. 15 is the same as the processing in steps S40 to S44 in FIG. 9. However, if the current position is not in the coverage area (No in S44), the tuning control unit 118 proceeds to step S60.

In step S60, from among the vertices defining the coverage area, the area map generating unit 228 detects vertices with distances from the current position that are equal to or less than the distance threshold value δ determined in step S41, and detects points located on a side of the existing coverage area at distances from the current position equal to the distance threshold value 5 determined in step S41. Here, in the processing in step S60, the area map generating unit 228 only needs to detect vertices included in a circle with radius δ centered on the current position and the points of intersection of this circle with sides of the coverage area. Then the area map generating unit 228 determines whether or not there are two or more such points (S61). If there are two or more such points (Yes in S61), the area map generating unit 228 proceeds to step S62; if there are fewer than two such points (No in S61), it proceeds to step S48.

In step S62, the area map generating unit 228 adds the positional information indicating the current position detected in step S40 to the coverage area information. For example, from among the vertices with distances from the current position that are equal to or less than the threshold value δ and the points on the side of the coverage area with a distance from the current position that is indicated by the threshold value δ, the area map generating unit 228 selects two points as linked points (linked positions). The area map generating unit 228 also defines a polygon formed by the line segments between the current position and the selected linked points and the line segment between the selected linked points. Then the area map generating unit 228 combines the identified polygon with the existing coverage area to generate a new coverage area. The area map generating unit 228 deletes vertices that are included in the interior of the new coverage area here from the coverage area information.

Next, the area map generating unit 228 determines whether or not the coverage area newly generated in step S62 has an indentation (S63). For example, the area map generating unit 228 can determine that an indentation has occurred at a vertex of the defined polygon when, of the angles formed by the two sides that meet at the vertex, the angle exterior to the coverage area is less than 180 degrees, in other words, when the angle measured clockwise from the side preceding the vertex to the side following the vertex is less than 180 degrees.

For another example, when the area map generating unit 228 links the identified polygon by using a point on a side of the existing coverage area, it can determine that an indentation is generated at this point. In addition, when an extension line of the line segment between the added current position and a linked position has a point of intersection with a side of the coverage area, the area map generating unit 228 can also determine that an indentation is generated at the linked point.

The area map generating unit 228 now proceeds to step S64 if there is an indentation in the newly generated coverage area (Yes in S63), and to step S53 if there is no indentation in the newly generated coverage area (No in S63).

In step S64, the area map generating unit 228 divides the coverage area newly generated in step S62 so as to eliminate the indentation, and updates the broadcast area map information 140 to include the divided coverage area. The area map generating unit 228 then proceeds to step S53.

If it determined in step S61 that are fewer than two points at distances equal to or less than the distance indicated by the threshold value δ determined in step S41 from the current position (No in S61), the area map generating unit 228 proceeds to step S48. The processing in steps S48 and S49 in FIG. 15 is the same as in steps S48 and S49 in FIG. 9. However, when the area map generating unit 228 determines in step S49 that there are two or more unlinked points (other than the current position) stored in association with the broadcast station detected by the channel scan in the unlinked point list column 141d in the unlinked list information 141 (Yes in S49), it proceeds to step S65.

In step S65, from among the unlinked points that have been stored in the unlinked point list column 141d in association with the broadcast station detected by the channel scan, the area map generating unit 228 detects unlinked points with distances from the current position equal to or less than the distance indicated by the threshold value δ determined in step S41, and, from among points on the line segments between these unlinked points, points at distances from the current position equal to the distance indicated by the threshold value δ determined in step S41. Then the area map generating unit 228 decides whether or not there are two or more such points (among the unlinked points and points on the sides) (S66). If there are two or more such points (Yes in S66), the area map generating unit 228 proceeds to step S67; if there are fewer than two such points (No in S66), it proceeds to step S53.

In step S67, the area map generating unit 228 generates a new coverage area from the two or more points detected in step S65 and the current position obtained in step S40. In other words, the area map generating unit 228 stores positional information indicating these points and the current position in association with the broadcast station detected by the channel scan in the broadcast area map information 140. The area map generating unit 228 deletes the positional information indicating these unlinked points and current position from the unlinked list information 141. If the newly generated coverage area touches or overlaps an existing coverage area, the area map generating unit 228 may combine the newly generated coverage area with the existing coverage area. It is desirable in this case to combine the newly generated coverage area with the existing coverage area when, for example, the newly generated coverage area has a vertex on a side of or in the interior of the existing coverage area. The area map generating unit 228 then proceeds to step S63.

The processing in step S53 in FIG. 15 is the same as the processing in step S53 in FIG. 9.

Figure 16:
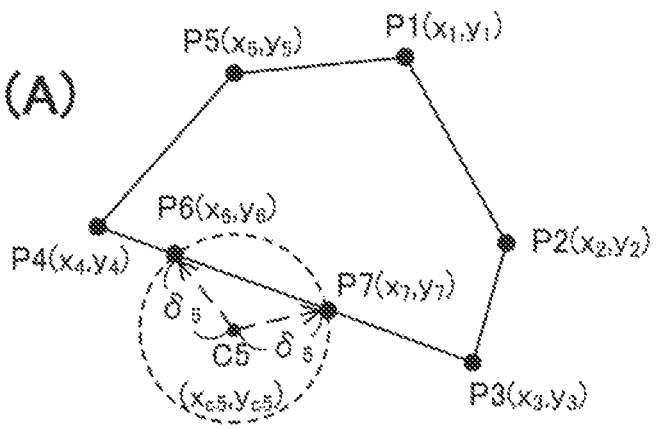
FIGS. 16(A) to 16(C) are schematic diagrams illustrating a first exemplary update of the coverage area in the digital broadcasting reception apparatus in the second embodiment.
Figure 16:
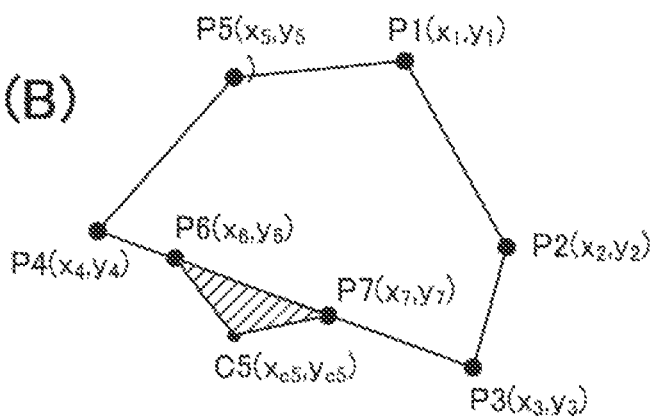
Figure 16:
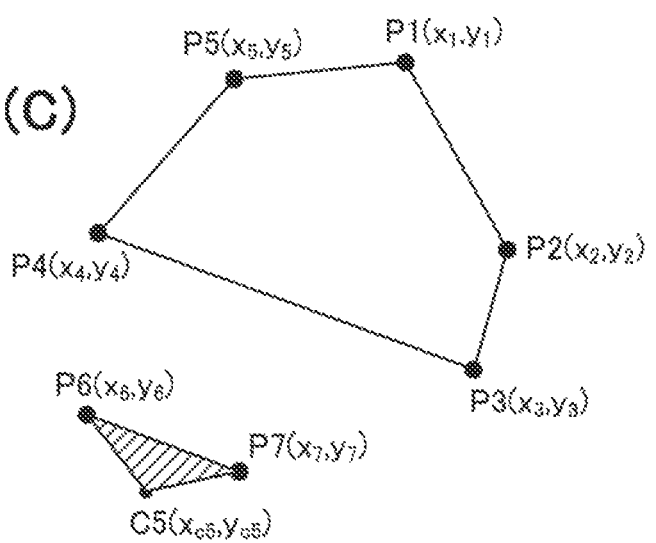
Figure 17:
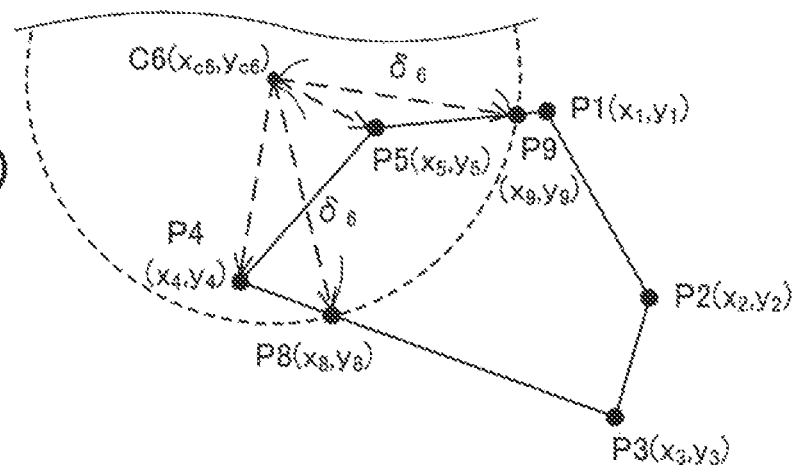
FIGS. 17(A) to 17(C) are diagrams illustrating a second exemplary update of the coverage area in the digital broadcasting reception apparatus in the second embodiment.
Figure 17:
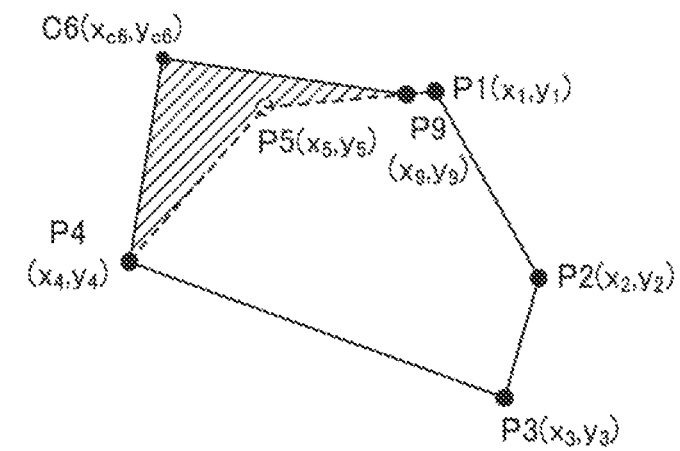
Figure 17:
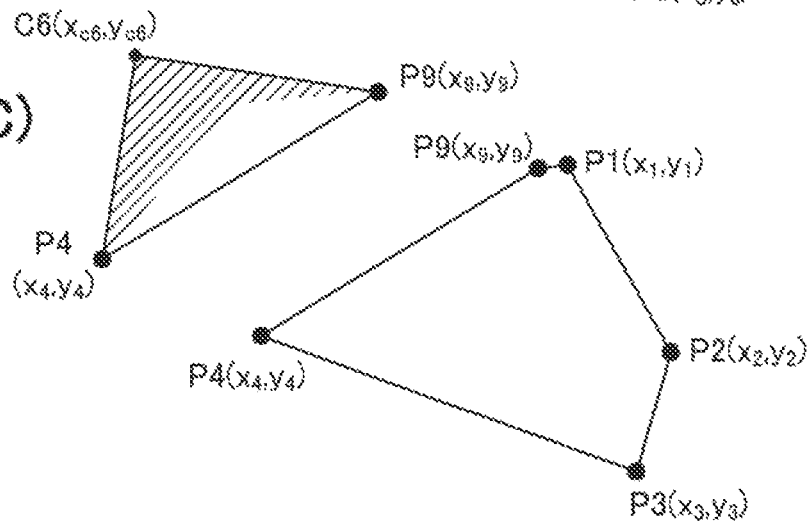

FIGS. 16(A) to 16(C) are schematic diagrams illustrating a first exemplary update of the coverage area in the digital broadcasting reception apparatus 200 in the second embodiment. FIGS. 17(A) to 17(C) are diagrams illustrating a second exemplary update of the coverage area in the digital broadcasting reception apparatus 200 in the second embodiment. The processing in step S64 in FIG. 15 will be specifically described with reference to FIGS. 16(A) to 16(C) and FIGS. 17(A) to 17(C).

Referring first to FIG. 16(A), suppose that vertices P1, P2, P3, P4, and P5 are stored in the coverage area column 140d in this sequence, that the current position is position C5, and that the distance threshold value determined by the received strength of the signal received at the current position C5 is $\delta_5$.

In the example shown in FIG. 16(A), there is no vertex whose distance from the current position C5 is less than the threshold value $\delta_5$. Thus, from among the points on the sides forming the existing coverage area, the points P6 and P7 whose distance from the current position C5 is the threshold value $\delta_5$ are detected. These points are points of intersection of the circle of radius $\delta_5$ centered on the current position C5 with the boundary of the coverage area.

As shown in FIG. 16(B), the polygon to be combined with the existing coverage area is a triangle (the hatched area in FIG. 16(B)) formed by points P6 and P7 and the current position C5. The vertices of the new coverage area resulting from this combination are vertex P1, vertex P2, vertex P3, vertex P7, the current position C5, vertex P6, vertex P4, and vertex P5.

At this time, since indentations are formed at the newly added vertices P6 and P7, in other words, since vertices P6 and P7 project inwardly toward the coverage area, the coverage area is divided along the line segment linking vertices P6 and P7. Accordingly, a coverage area with a vertex list consisting of vertices P1, P2, P3, P4, and P5 and a coverage area with a vertex list consisting of vertex P7, the current position C5, and vertex P6 are stored in the broadcast area map information 140, as shown in FIG. 16(C).

In FIG. 17(A), suppose that vertices P1, P2, P3, P4, and P5 are stored in the coverage area column 140d in this sequence, that the current position is C6, and that the distance threshold value determined from the received strength of the signal received at the current position C6 is 66.

In the example shown in FIG. 17(A), vertices P4 and P5 are detected as existing vertices whose distances from the current position C6 are less than the threshold value $\delta 6$. In addition, from among the points on the sides forming the existing coverage area, the points P8 and P9 whose distance from the current position C6 equal to the threshold value $\delta 6$ are detected.

As shown in FIG. 17(B), from among the line segments linking these points (P4, P5, P8, and P9) to the current position C6, two line segments are selected and the polygon (the hatched area in FIG. 17(B)) formed by the two line segments and portions of the sides of the existing coverage area is determined to be the coverage area to be newly added. The two line segments are determined by the same procedure in the second embodiment as in the first embodiment. For example, the two line segments with the greatest angle between them are selected. As a result, point P9 and the current position C6 are added as new vertices to the vertex list, while vertex P5 is removed from the vertex list because it is included in the interior of the new coverage area. Accordingly, the vertices of the new coverage area are vertex P1, vertex P2, vertex P3, vertex P4, the current position C6, and vertex P9.

An indentation has now been generated at the newly added vertex P9, so the coverage area is divided along a line segment extending from vertex P9 to one of the remaining vertices, such as the diagonal segment between vertices P9 and P4, for example. Therefore, as shown in FIG. 17(C), a coverage area with a vertex list consisting of vertices P1, P2, P3, P4, and P9 and a coverage area with a vertex list consisting of vertex P4, the current position C6, and vertex P9 are stored in the broadcast area map information 140.

Division to eliminate indentations is not limited to the above example. For example, it would be possible to extend the line segment linking vertex P1 and point P9, obtain the point of intersection with the line segment between the current position C6 and vertex P4, and split off the polygon formed by the intersection point, current position C6, and point P9. Likewise, it would be possible to extend the line segment linking the current position C6 and point P9, obtain the point of intersection between the extension line and the line segment between vertices P1 and P2, and split off the polygon formed by the intersection point, vertex P9, and vertex P1.

In this way, the combined coverage area is checked for the presence or absence of an indentation in its shape, and if an indentation is found, the coverage area is divided in order to eliminate the indentation, so all the coverage areas stored in the area map storage unit 129 can be represented by convex shapes. As a result, in the process for ascertaining whether or not the current position is included in the convex shape, it is only necessary to check the signs of outer products of vectors from the current position to individual vertices and vectors between individual vertices. For example, if the vertex list of the coverage area lists vertices P1, P2, and P3 in this order, the sign of the outer product of the vector linking the current position C and vertex P1 and the vector linking vertices P1 and P2 and the sign of the outer product of the vector linking the current position C and vertex P2 and the vector linking between vertices P2 and P3 are determined, and if these signs are both the same, then it can be concluded that the current position is within the coverage area. Therefore, the second embodiment can eliminate the need to perform complicated calculations such as determining angles between line segments from the current position to individual vertices, as was done in the first embodiment.

In the second embodiment, by determining a simple equation for each of the sides of the coverage area and computing linear inequalities, for example, it is possible to determine whether or nor the current position is within the coverage area. Therefore, the computational load is lighter in the second embodiment than in the first embodiment.

As described above, when a receivable position is newly detected, the digital broadcasting reception apparatus 200 in the second embodiment enables a polygon including the newly detected receivable position to be joined to a portion of a side of the existing coverage area. As a result, the digital broadcasting reception apparatus 200 in the second embodiment enables more faithful recording of a shape closer to the actual shape of the coverage area, particularly when the shape has a side with a pointed projecting part.

When as a result of the process of enlarging a coverage area an indentation is formed in the coverage area, the digital broadcasting reception apparatus 200 in the second embodiment divides the coverage area into a plurality of shapes without indentations. This enables the digital broadcasting reception apparatus 200 in the second embodiment to determine whether or not the current position is within a coverage area by executing only linear computations, instead of performing more complex calculations such as the calculation of angles by use of inverse trigonometric functions. As a result, the program viewing disabled period can be shortened.

In particular, even when the shape of the boundary of the actual coverage area is a shape having a side with a pointed projection, the digital broadcasting reception apparatus 200 in the second embodiment can reproduce that shape. Therefore, when the current position is located at the base of the projection, if the signal from the broadcast station being viewed becomes unreceivable or if a station selection instruction that calls for the selection of a non-receivable broadcast station is received and automatic station selection is performed, the digital broadcasting reception apparatus 200 in the second embodiment can select a broadcast station that is receivable at that position without performing uncalled-for selection of relay and affiliated stations. In addition, the program viewing disabled period can be shortened because a search of all physical channels can be initiated quickly.

Third Embodiment

As shown in FIG. 1, the digital broadcasting reception apparatus 300 in the third embodiment includes a first antenna 110, a first reception unit 111, a first signal strength detection unit 112, a first demultiplexing unit 113, a decoding unit 114, a video output unit 115, an audio output unit 116, an operation input unit 117, and a tuning control unit 318. The digital broadcasting reception apparatus 300 in the third embodiment also includes a second antenna 120, a second reception unit 121, a second signal strength detection unit 122, a second demultiplexing unit 123, a reception mode switching unit 124, a channel scan control unit 125, a third antenna 126, a current position detection unit 127, an area map generating unit 128, and an area map storage unit 129. The digital broadcasting reception apparatus 300 in the third embodiment differs from the digital broadcasting reception apparatus 100 in the first embodiment in regard to the processing in the tuning control unit 318.

The tuning control unit 318 in the third embodiment differs from the tuning control unit 118 in the first embodiment in regard to the process for ascertaining whether or not the current position is located in the coverage area. This will be specifically described below.

Figure 18:
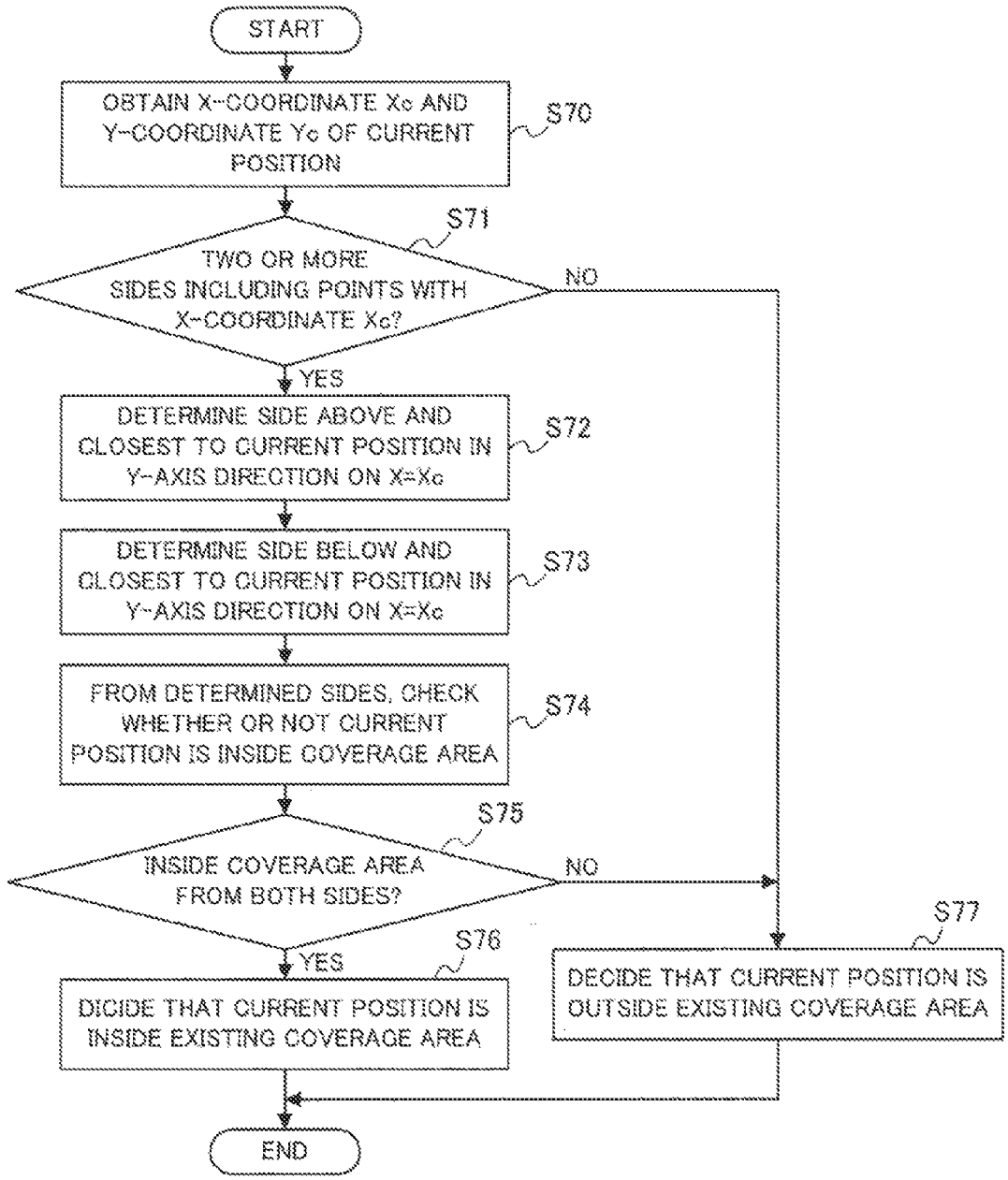
FIG. 18 is a flowchart illustrating a flow of processing for ascertaining whether or not the current position is included in a coverage area in the digital broadcasting reception apparatus in the third embodiment.

FIG. 18 is a flowchart illustrating a flow of processing for ascertaining whether or not the current position is within the coverage area in the digital broadcasting reception apparatus 300 in the third embodiment. The processing flow in FIG. 18 is performed in step S15 in FIG. 5 or FIG. 6.

First, the tuning control unit 318 acquires the x-coordinate value $X_c$ and y-coordinate value $Y_c$ of the current position C (S70). Next, the tuning control unit 318 determines whether or not there are two or more sides with an x-coordinate value of $X_c$ among the sides forming the coverage area of interest (S71). For example, the tuning control unit 318 may determine whether or not there are two or more sides including points at which the linear function representing the side intersects the linear function expressed by the following equation (6), or may make the determination in some other way.

$$x = X_c \qquad (6)$$

If the tuning control unit 318 determines that there are two or more such sides (Yes in S71), it proceeds to step S72; if it determines that there are fewer than two such sides (No in S71), it proceeds to step S77.

In step S72, from among the sides having a point with an x coordinate value of $X_c$, the tuning control unit 318 selects the side L1 that is above and closest to the current position C. For example, from the points of intersection with the line expressed by equation (6) found in step S71, the tuning control unit 318 only has to detect the side whose point of intersection has the smallest y-coordinate value greater than $Y_c$.

Next, from among the sides having a point with an x-coordinate value of $X_c$, the tuning control unit 318 selects the side L2 that is below and closest to the current position C (S73). For example, from the points of intersection with the line expressed by equation (6) found in step S71, the tuning control unit 318 only has to detect the side whose point of intersection has the greatest y-coordinate value less than $Y_c$.

Next, the tuning control unit 318 identifies positional relationships between the current position and the sides selected in steps S72 and S73, and thereby determines whether or not the current position is inside the coverage area (S74). For example, the tuning control unit 318 only has to take the outer product of the vector of each side and the vector pointing up in the y-axis direction to determine whether the inside of the coverage area lies above or below each side in the y-axis direction, and then decide from these results whether or not the current position is within the coverage area with respect to both sides selected in steps S72 and S73. If it determines that the current position is within the coverage area with respect to both sides selected in steps S72 and S73 (Yes in S75), the tuning control unit 318 proceeds to step S76. If the tuning control unit 318 determines that the current position is outside the coverage area with respect to one of the sides selected in steps S72 and S73 (No in S75), it proceeds to step S77.

In step S76, the tuning control unit 318 determines that the current position is within the coverage area of interest. In step S77, the tuning control unit 318 determines that the current position is outside of the coverage area of interest.

Figure 19:
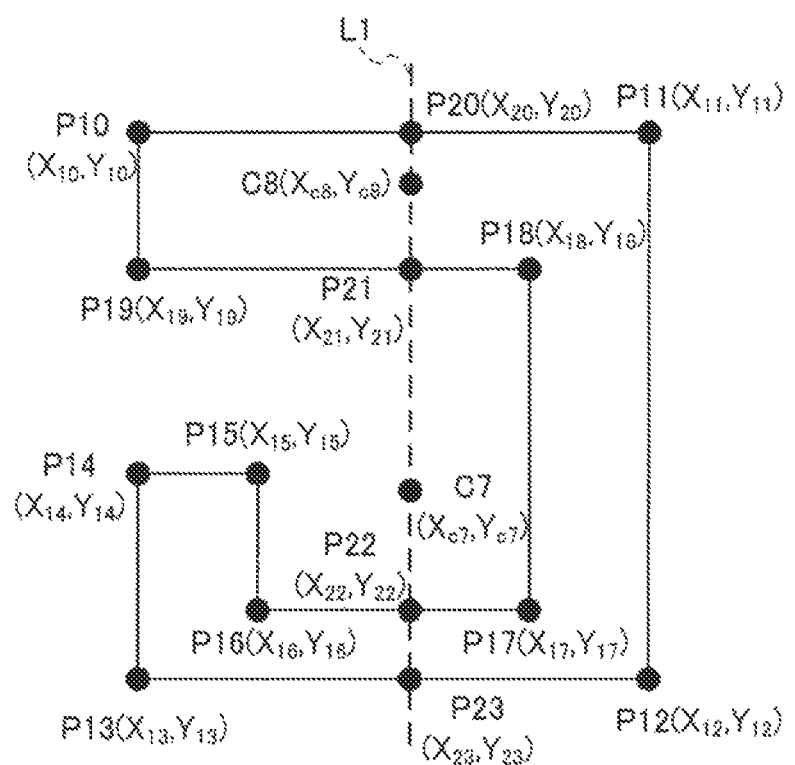
FIG. 19 is a schematic diagram illustrating an exemplary process for ascertaining whether or not the current position is within the coverage area in the digital broadcasting reception apparatus in the third embodiment.

The process in the flow illustrated in FIG. 18 will be specifically described with reference to FIG. 19. FIG. 19 is a schematic diagram illustrating an exemplary process for ascertaining whether or not the current position is within the coverage area in the digital broadcasting reception apparatus 300 according to the third embodiment.

In FIG. 19, it will be assumed that vertices P10, P11, P12, P13, P14, P15, P16, P17, P18, and P19 are stored in this sequence in the coverage area column 140d as a list of vertices representing a coverage area. FIG. 19 illustrates both a case in which the current position is position C7 and a case in which the current is position C8.

First, in the case in which the current position is position C7, the tuning control unit 318 focuses on the x-coordinate value $X_{c7}$ of the current position C7, and detects sides of the coverage area having a point whose x-coordinate value is $X_{c7}$. For example, the tuning control unit 318 detects sides having a point of intersection with the line L1 shown in FIG. 19. Here, the tuning control unit 318 detects the sides between vertices P10 and P11, between vertices P12 and P13, between vertices P16 and P17, and between vertices P18 and P19.

Next, the tuning control unit 318 determines the vertical relationships of the detected sides in the y-axis direction on line L1. The tuning control unit 318 determines these vertical relationships from, for example, the y-coordinates of the points of intersection of the sides with line L1. Here, the y-axis value Y22 of intersection point P22 is greater than the y-axis value Y23 of intersection point P23, the y-axis value Y21 of intersection point P21 is greater than the y-axis value Y22 of intersection point P22, the y-axis value Y20 of intersection point P20 is greater than the y-axis value Y21 of intersection point P21. Therefore, the tuning control unit 318 determines that the side between vertex P16 and vertex P17 is above the side between vertex P12 and vertex P13, the side between vertex P18 and vertex P19 is above the side between vertex P16 and vertex P17, and the side between vertex P10 and vertex P11 is above the side between vertex P18 and vertex P19.

Similarly, the tuning control unit 318 determines the vertical relationships between the current position C7 and the sides, and identifies the nearest side above the current position C7 and the nearest side below the current position C7. Here, the side between vertex 18 and vertex 19 is identified as the nearest side above the current position C7 and the side between vertex P16 and vertex P17 is identified as the nearest side below the current position C7.

Next, the tuning control unit 318 determines whether or not the current position C7 is interior to the coverage area with respect to each of the nearest sides. The tuning control unit 318 may also make this determination from, for example, the sign of the outer product of the vector from vertex P18 to vertex P19 and the vector from vertex P18 to the current position C7. Alternatively, it is possible to determine in advance whether the interior of the coverage area is up or down, on the y-axis, from the side between vertices P18 and P19 by setting a point P18#1 obtained by adding '1' to the y-coordinate of vertex P18 and taking the outer product of the vector from vertex P18 to vertex P19 and the vector from vertex P18 to point P18#1, so the tuning control unit 318 may determine from this result whether or not the current position C7 is interior to the coverage area with respect to the side between vertices P18 and P19. For example, since the vertex list is stored in clockwise order here, a point whose outer product with the vector from vertex P18 and vertex P19 gives a negative result can be determined to be interior to the coverage area. In the example shown in FIG. 19, the tuning control unit 318 can determine that the current position C7 is outside the coverage area with respect to the nearest side (P18-P19) above it. Similarly, the tuning control unit 318 can determine that the current position C7 is outside the coverage area with respect to the nearest side (P16-P17) below it. Accordingly, since the current position C7 is outside the coverage area with respect to both of the two nearest sides, the tuning control unit 318 can determine that the current position C7 is outside the coverage area of interest.

If the current position is position C8 in FIG. 19, the tuning control unit 318 performs the same process as above, determining that the nearest side above the current position C8 is the side between vertices P10 and P11 and the nearest side below the current position C8 is the side between vertices P18 and P19. As noted above, points above the side between vertices P18 and P19 in the y-axis direction are inside the coverage area. Moreover, points below the side between vertices P10 and P11 in the y-axis direction are inside the coverage area. From these results, since the current position C8 is inside the coverage area with respect to both of the two nearest sides, the tuning control unit 318 can determine that the current position C8 is inside the coverage area of interest.

Figure 20:
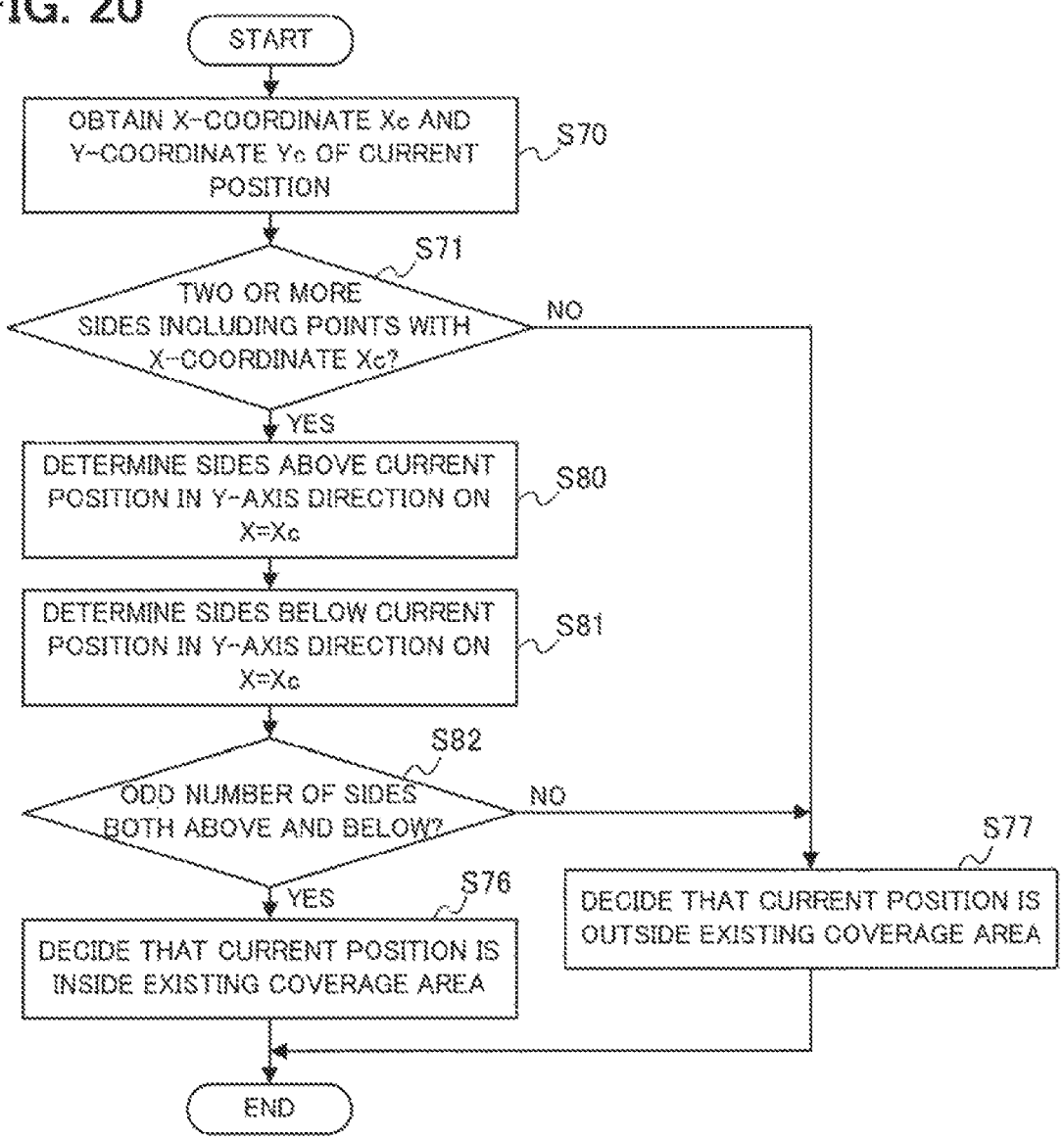
FIG. 20 is a flowchart showing a variation of the processing flow for ascertaining whether or not the current position is included in the coverage area in the digital broadcasting reception apparatus in the third embodiment.

FIG. 20 is a flowchart showing a variation of the processing flow for ascertaining whether or not the current position is included in the coverage area in the digital broadcasting reception apparatus 300 in the third embodiment. The flow shown in FIG. 20 is a simplification of the flow shown in FIG. 18. Processes in the flow shown in FIG. 20 that are the same as in the flow shown in FIG. 18 have the same reference characters.

The processing in steps S71 and S71 in FIG. 20 is the same as the processing in steps S70 and S71 in FIG. 18. In step S71 in FIG. 20, however, if the tuning control unit 318 determines that there are two or more sides having a point with an x-coordinate value of $X_c$ among the sides forming the coverage area of interest (Yes in S71), it proceeds to step S80.

In step S80, from among the sides having a point with an x-coordinate value of $X_c$, the tuning control unit 318 determines all the sides located above the current position C.

Next, from among the sides having a point with an x-coordinate value of $X_c$, the tuning control unit 318 determines all the sides located below the current position C (S81).

Next, the tuning control unit 318 decides whether or not the number of the sides determined in step S80 and the number of the sides determined in step S81 are both odd (S82). The tuning control unit 318 then proceeds to step S76 if both numbers of determined sides are odd (Yes in S82), and to step S77 if one of these numbers of determined sides is even. The processing in steps S76 and S77 in FIG. 20 is the same as the processing in steps S76 and S77 in FIG. 18.

The processing flow in FIG. 20 will now be specifically described. The existence of two sides above or below the current position C implies the existence, above or below the current position C, of a side representing an upper edge of the coverage area paired with a side representing a lower edge of the coverage area. Similarly, the existence of any even number of such sides implies the existence, above or below the current position C, of a number of upper-lower pairs of sides of the coverage area. Therefore, when there are an even number of sides above or below the current position C, the current position C can be determined not to be included in the coverage area.

In contrast, the existence of the current position C within the coverage area requires the existence of a side representing an upper edge of the coverage area located above the current position C and a side representing a lower edge of the coverage area located below the current position C. Therefore, above the current position C, in addition to the even number of sides of parts of the coverage area not including the current position C as described above, there is an upper side of a part of the coverage area including the current position C. Below the current position C, in addition to the even number of sides of coverage areas not including the current position C, there is a lower side of a part of the coverage area including the current position C. Accordingly, if the current position C is included in a certain coverage area, it follows that there are an odd number of sides above and an odd number of sides below the current position C.

The processing flow in FIG. 20 will be described with reference to FIG. 19.

First, if the current position is position C7 in FIG. 19, from the x-coordinate value of $X_{c7}$ of the current position C7, the tuning control unit 318 detects sides having points with an x-coordinate value of '$X_{c7}$' from among the sides in the coverage area. For example, the tuning control unit 318 may check the x-coordinates of the vertices at both ends of each of the sides to detect, as relevant sides, sides with a vertex value at one end that is less than $X_{c7}$ and a vertex value at the other end that is greater than $X_{c7}$. Alternatively, it may take sides having points of intersection with the line expressed by the following equation (7) as relevant sides.

$$x = X_{c7} \qquad (7)$$

The tuning control unit 318 may also determine the relevant sides in some other way.

Here, the sides between vertices P10 and P11, between vertices P12 and P13, between vertices P16 and P17, and between vertices P18 and P19 are found.

Next, the tuning control unit 318 checks whether each of the detected sides is located upward or downward from the current position C7 in the y-axis direction. For example, the tuning control unit 318 may compare the y-coordinate value of the point of intersection between the line expressed by the above equation (7) and each of the sides with the y-coordinate value $Y_{c7}$ of the current position C7. The tuning control unit 318 may also check the y-coordinate values of the vertices at both ends of each of the sides. A side is determined to be located above the current position C7 if both values are greater than $Y_{c7}$, and below the current position C7 if both values are less than $Y_{c7}$. If one value is greater than $Y_{c7}$ and the other value is less than $Y_{c7}$, the tuning control unit 318 may then find the point of intersection of the side with the line expressed by equation (7) to determine whether it is above or below. This determination may also be made by other methods.

As a result of the check made in this example, the tuning control unit 318 recognizes that the sides located above the current position C7 are the side between vertices P10 and P11 and the side between vertices P18 and P19, and that the sides located below the current position C7 are the side between vertices P12 and P13 and the side between vertices P16 and P17.

Next the tuning control unit 318 checks the number of sides located above the current position C7 and the number of the sides located below the current position C7; here, because there are two each, the current position C7 is determined to be outside the coverage area.

In FIG. 19, if the current position is position C8, the tuning control unit 318 performs the same process as above to determine that the side above the current, position C8 is the side between vertices P10 and P11 and that the sides below the current position C8 are the sides between vertices P12 and P13, between vertices P16 and P17, and between vertices P18 and P19. Since the number of sides located above the current position C8 is one and the number of sides located below the current position C8 is three, which are both odd numbers, the tuning control unit 318 can determine that the current position C8 is within the coverage area.

As described above, the digital broadcasting reception apparatus 300 in the third embodiment makes it possible to determine whether or not the current position is within the territory of a coverage area more easily. In addition, the digital broadcasting reception apparatus 300 can reduce the time required for detecting the coverage areas of broadcast stations receivable at the current position in automatic station selection, and can consequently reduce the program viewing disabled period.

The exemplary process described above is based on the x-coordinate value, but the tuning control unit 318 may use the y-coordinate value instead of the x-coordinate value to determine whether or not the current position is included in the coverage area. This is obvious, so a description will be omitted.

The above description applies the process in the third embodiment to the first embodiment, but it is also possible to apply the process in the third embodiment to the second embodiment.

Fourth Embodiment

As shown in FIG. 1, the digital broadcasting reception apparatus 400 in the fourth embodiment includes a first antenna 110, a first reception unit 111, a first signal strength detection unit 112, a first demultiplexing unit 113, a decoding unit 114, a video output unit 115, an audio output unit 116, an operation input unit 117, and a tuning control unit 118. The digital broadcasting reception apparatus 400 in the fourth embodiment also includes a second antenna 120, a second reception unit 121, a second signal strength detection unit 122, a second demultiplexing unit 123, a reception mode switching unit 124, a channel scan control unit 125, a third antenna 126, a current position detection unit 127, an area map generating unit 428, and an area map storage unit 129.

The digital broadcasting reception apparatus 400 in the fourth embodiment differs from the digital broadcasting reception apparatus 100 in the first embodiment in regard to the processing in the area map generating unit 428.

In addition to performing the same processing as the area map generating unit 128 in the first embodiment, the area map generating unit 428 in the fourth embodiment performs a process for merging a plurality of coverage areas.

Figure 21:
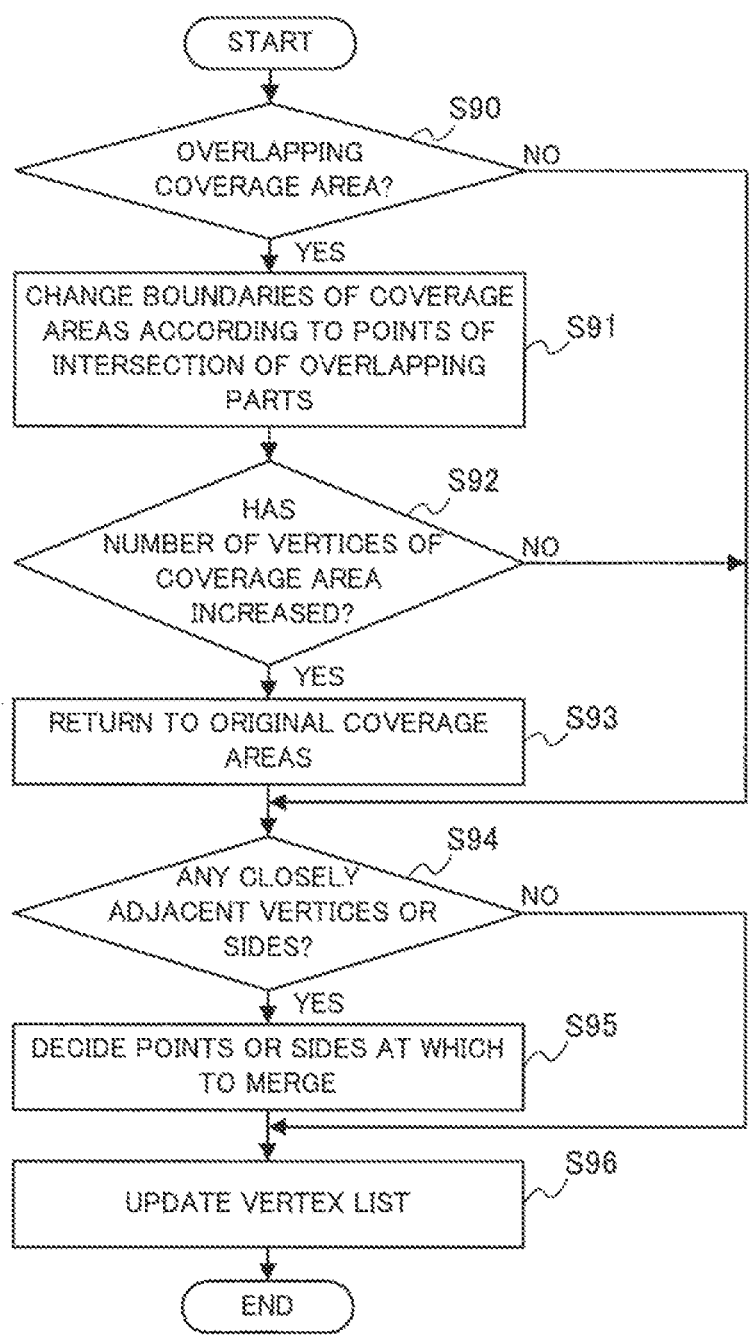
FIG. 21 is a flowchart illustrating a flow of processing for merging a plurality of coverage areas in the digital broadcasting reception apparatus in the fourth embodiment.

FIG. 21 is a flowchart illustrating the flow of processing for merging a plurality of coverage areas in the digital broadcasting reception apparatus 400 in the fourth embodiment. The processing flow in FIG. 21 starts when, for example, the channel scan control unit 125 finds a new broadcast station and the area map generating unit 428 attempts to add new information to the area map storage unit 129 but finds that it has run out of free space or is close to running out of free space.

First, the area map generating unit 428 checks for overlap between coverage areas (S90). For example, if a coverage area includes a vertex of another coverage area, the area map generating unit 428 decides that the two coverage areas overlap. The area map generating unit 428 can also decide that two coverage areas overlap if a side of one of the coverage areas has a point of intersection with a side of the other coverage area. The area map generating unit 428 may also make these decisions other ways. When it finds overlapping coverage areas (Yes in S90), the area map generating unit 428 proceeds to step S91; if it determines that there are no overlapping coverage areas (No in S90), it proceeds to step S94.

In step S91, the area map generating unit 428 finds the points of intersection of the overlapping portions of the coverage areas and updates the boundaries of each of the coverage areas with lines linking these points of intersection (S91).

Next, the area map generating unit 428 determines whether the process performed in step S91 has increased the number of vertices of the coverage areas (S92). For example, the area map generating unit 428 decides that the number of the vertices of the coverage areas has increased when the value obtained by subtracting the number of vertices deleted from the plurality of coverage area having overlapping portions from the number of vertices added to this plurality of coverage areas is positive. If the area map generating unit 428 determines that the number of the vertices of the coverage areas has increased (Yes in S92), it proceeds to step S93; if it determines that the number of the vertices has not increased (No in S92), it proceeds to step S94.

In step S93, the area map generating unit 428 returns the coverage areas to their state before the processing in step S91 was performed. The area map generating unit 428 then proceeds to step S94.

In step S94, the area map generating unit 428 determines whether or not there are any closely adjacent vertices or sides in one or a plurality of coverage areas. The area map generating unit 428 determines, for example, whether two vertices are adjacent in that they are separated by a distance within a predetermined distance range, whether two sides are adjacent in that they are separated by a distance within a predetermined distance range, or whether the angle between two sides is equal to or less than a predetermined angle. The area map generating unit 428 proceeds to step S95 when it determines that there are closely adjacent vertices or sides (Yes in S94), and to step S96 when it determines that there are no closely adjacent vertices or sides (No in S94).

In step S95, the area map generating unit 428 performs processing for merging the closely adjacent vertices or sides. For example, the area map generating unit 428 changes one of the closely adjacent vertices to the other vertex or changes the midpoint between closely adjacent vertices to a new vertex. The area map generating unit 428 also adds new vertices so that closely adjacent sides are partially or wholly included in the coverage area.

FIGS. 22(A) to 22(D) are schematic diagrams illustrating a first exemplary merging process performed for closely adjacent sides in the fourth embodiment. FIGS. 23(A) to 23(C) and FIGS. 24(A) and 24(B) are schematic diagrams illustrating a second exemplary merging process for closely adjacent sides.

Figure 22:
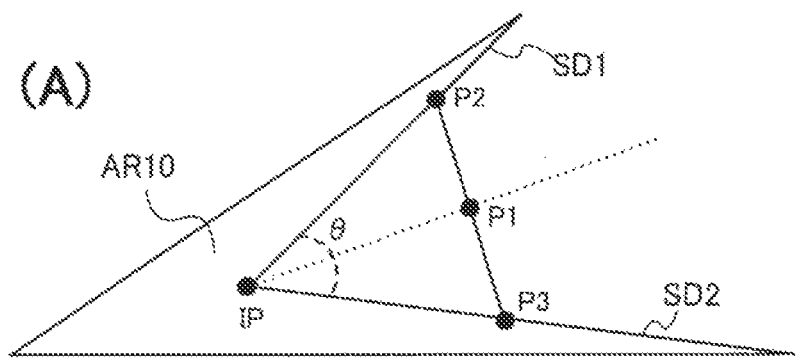
FIGS. 22(A) to 22(D) are schematic diagrams illustrating a first exemplary merging process performed for closely adjacent sides in the fourth embodiment.
Figure 22:
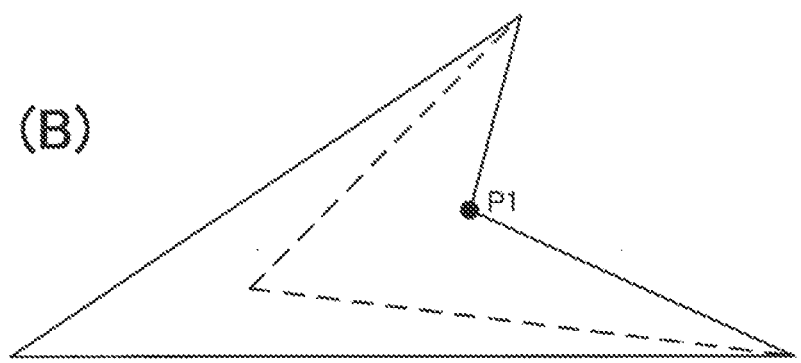
Figure 22:
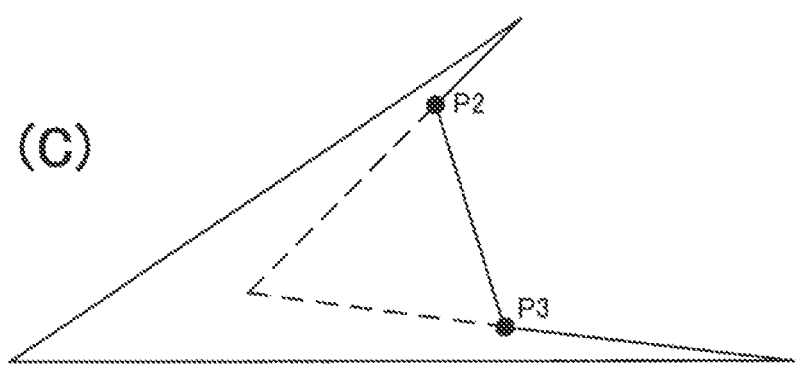
Figure 22:
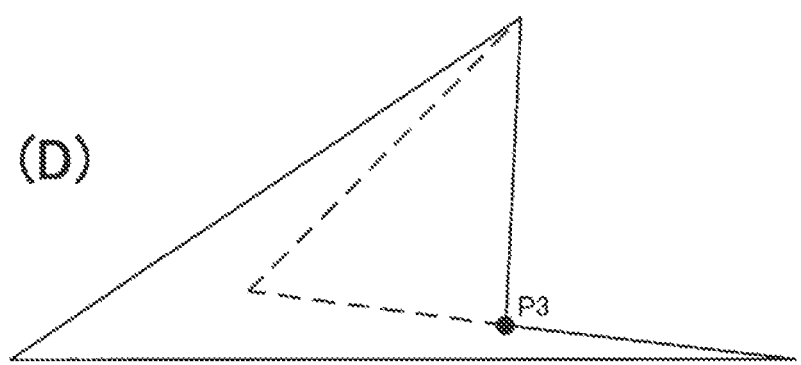

The angle θ formed between sides SD1 and SD2 of the coverage area AR10 shown in FIG. 22(A) is equal to or less than a predetermined threshold angle value.

In such cases, in the triangle having sides SD1 and SD2 as two of its sides, as shown in FIG. 22(B), for example, the area map generating unit 428 takes a point P1 on the median from the point of intersection IP of sides SD1 and SD2 as a new vertex. Point P1 can be any point on the median line, but the barycenter of the triangle, for example, may be taken.

In that case, as shown in FIG. 22(C), for example, the area map generating unit 428 may take the points of intersection P2 and P3 of sides SD1 and SD2 with a line passing through point P1 and crossing the median line right angles as new vertices. Alternatively, intersection point P3 may be taken as a new vertex as shown in FIG. 22(D), or, although this is not illustrated in the drawings, intersection point P2 may be taken as a new vertex.

Figure 23:
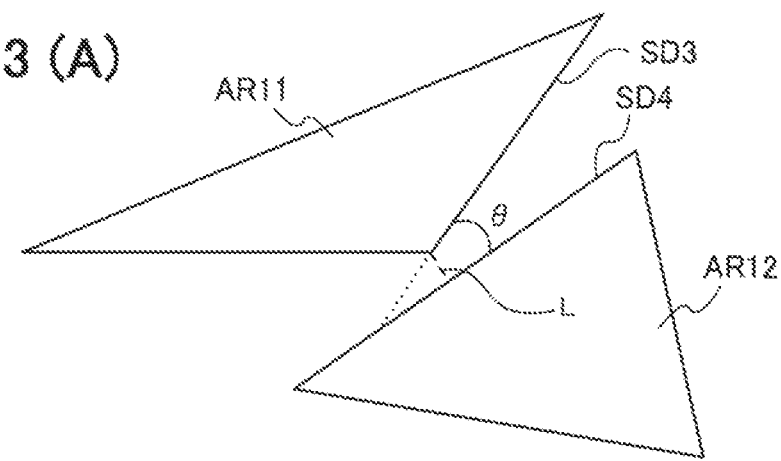
FIGS. 23(A) to 23(C) are schematic diagrams (part 1) illustrating a second exemplary merging process performed for closely adjacent sides in the fourth embodiment.
Figure 23:
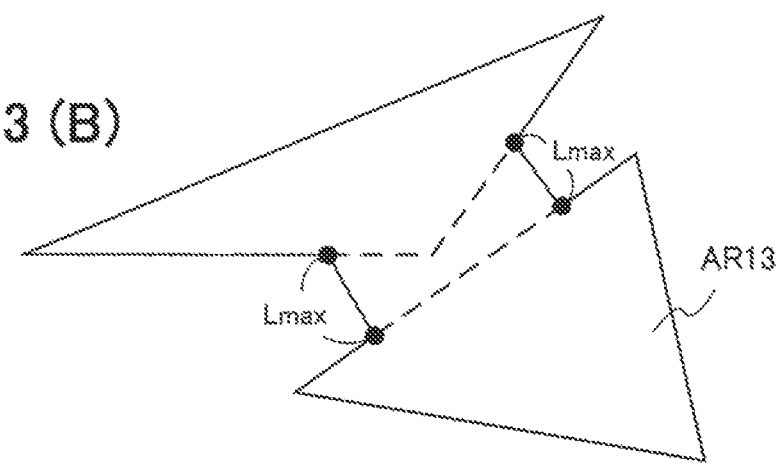
Figure 23:
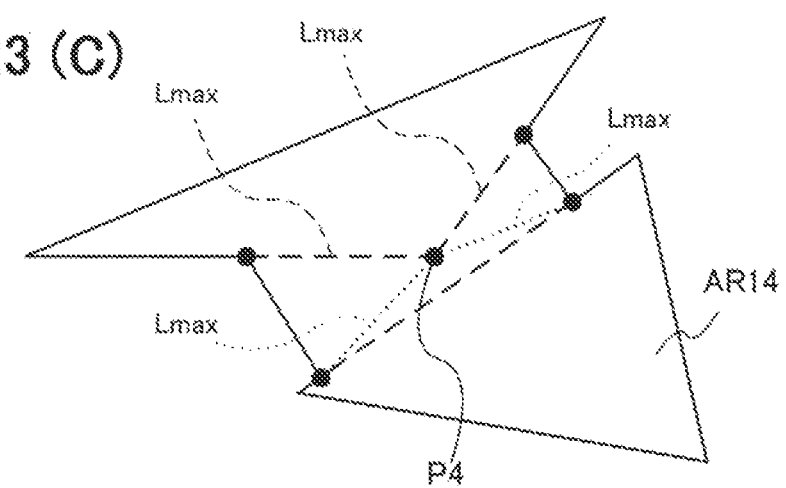

Moreover, in FIG. 23(A), the angle between side SD3 of coverage area AR11 and side SD4 of coverage area AR12 is equal to or less than a predetermined threshold angle, and the distance L between a point on a side of one area (a point on side SD3, here) and a side of the other area (side SD4, here) is equal to or less than a distance threshold value.

In such cases, as shown in FIG. 23(B), the area map generating unit 428 merges coverage areas AR11 and AR12. For example, the area map generating unit 428 generates a new coverage area AR13 with points at which the distance between a point on a side of one area (a point on side SD3, here) and a side of the other area (side SD4, here) is equal to a distance Lmax as vertices.

Alternatively, as shown in FIG. 23(C), for example, the area map generating unit 428 may in such cases generate a new coverage area AR14 by taking points at a distance Lmax from an existing vertex (vertex P4, here) on respective sides as vertices.

Figure 24:
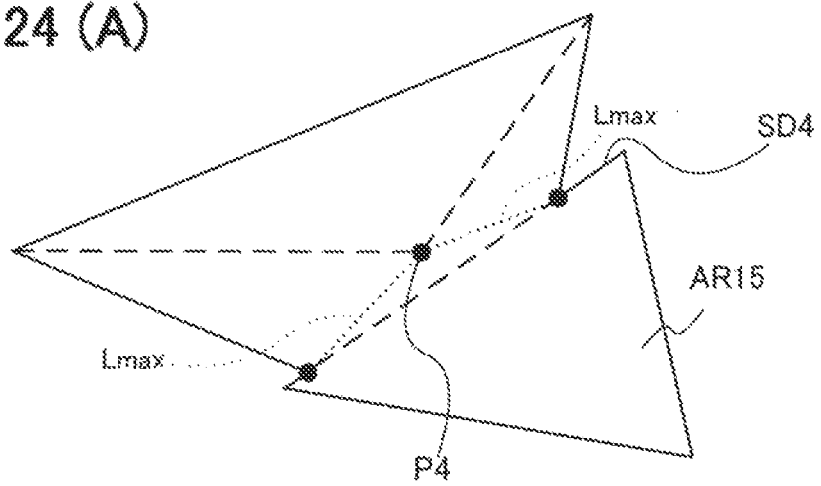
FIGS. 24(A) and 24(B) are schematic diagrams (part 2) illustrating the second exemplary merging process performed for closely adjacent sides in the fourth embodiment.
Figure 24:
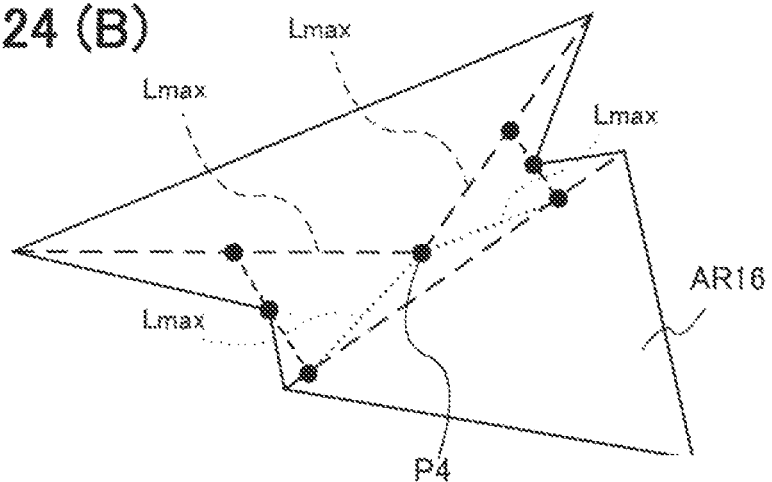

Moreover, as shown in FIG. 24(A), for example, the area map generating unit 428 may in such cases generate a new coverage area AR15 by taking points on one of the sides (points on side SD4, here) at a distance Lmax from an existing vertex (vertex P4, here) as vertices. Although not illustrated in the drawing, the area map generating unit 428 may also take points at a distance Lmax from vertex P4 on sides SD3 as vertices.

As a further alternative in such cases, as shown in FIG. 24(B), for example, the area map generating unit 428 may generate a new coverage area AR16 having the midpoints of line segments linking points on respective sides at a distance Lmax from an existing vertex (vertex P4, here) as vertices.

Returning to the flowchart in FIG. 21, in step S96, the area map generating unit 428 sets the results of the processing so far in the coverage area column 140*d* in the broadcast area map information 140 and terminates the processing flow.

As described above, the digital broadcasting reception apparatus 400 in the fourth embodiment enables one or a plurality of coverage areas to be merged by changing their vertices, sides, or coverage areas depending on the positional coincidence or proximity of their vertices and sides, so the amount of information to be stored in the area map storage unit 129 can be suitably reduced.

The processes in the fourth embodiment, which are applied to the first embodiment in the description above, may also be applied to the second or third embodiment.

REFERENCE CHARACTERS

100, 200, 300: digital broadcasting reception apparatus, 110: first antenna, 111: first reception unit, 112: first signal strength detection unit, 113: first demultiplexer unit, 114: decoding unit, 115: video output unit, 116: audio output unit, 117: operation input unit, 118, 318: tuning control unit, 120: second antenna, 121: second reception unit, 122: second signal strength detection unit, 123: second demultiplexer unit, 124: reception mode switching unit, 125: channel scan control unit, 126: third antenna, 127: current position detection unit, 128, 228, 428: area map generating unit, 129: area map storage unit.

What is claimed is:

1. A digital broadcasting reception apparatus comprising:
   a reception unit for receiving a signal from a physical channel;
   a signal strength detection unit for detecting a received strength of the signal received by the reception unit;
   a channel scan control unit for detecting a physical channel on which a broadcast signal can be received by the reception unit;
   an area map storage unit for storing three or more items of positional information indicating positions at which the broadcast signal can be received for each physical channel, thereby storing coverage area information indicating a coverage area bounded by the positions indicated by the positional information;
   a current position detection unit for detecting a current position;
   a tuning control unit for, when the channel scan control unit detects a physical channel on which the broadcast signal can be received by the reception unit, carrying out a process of determining whether or not the current position detected by the current position detection unit is included in the coverage area of the detected physical channel according to the coverage area information, and, when the detected current position is not included in the coverage area of the detected physical channel, carrying out a process of specifying a threshold value indicating a distance that increases as the received strength detected by the signal strength detection unit increases; and
   an area map generating unit for carrying out a process of selecting as linked positions, on a basis of the coverage area information, two positions among the positions included in the coverage area of the detected physical channel within a range of the distance indicated by the defined threshold value from the detected current position, and a process of enlarging the coverage area to lines linking the linked positions and the detected current position by adding positional information indicating the detected current position to the coverage area information of the detected physical channel.

2. The digital broadcasting reception apparatus of claim 1, wherein, the area map generating unit selects, as the linked positions, two positions among the positions indicated by the positional information included in the coverage area information of the detected physical channel within the range of the distance indicated by the defined threshold value from the detected current position.

3. The digital broadcasting reception apparatus of claim 2, wherein the area map generating unit carries out:
- a process of storing unlinked-position information indicating the detected current position in association with the detected physical channel in the area map storage unit when there are fewer than two positions among the positions indicated by the positional information included in the coverage area information of the detected physical channel within the range of the distance indicated by the defined threshold value from the detected current position; and
- a process of generating, when among the positions indicated by the unlinked-position information associated with the detected physical channel there are two or more positions within the range of the distance indicated by the defined threshold value from the detected current position, coverage area information including the unlinked-position information indicating the detected current position and the positions included in the range of the distance indicated by the defined threshold value from the detected current position.

4. The digital broadcasting reception apparatus of claim 1, wherein the area map generating unit selects, from among the positions indicated by the positional information included in the coverage area information of the detected physical channel, positions within the range of the distance indicated by the defined threshold value from the detected current position or, from among positions on a boundary of the coverage area of the detected physical channel, positions located at the distance indicated by the defined threshold value from the detected current position.

5. The digital broadcasting reception apparatus of claim 4, wherein the area map generating unit carries out:
- a process of storing unlinked-position information indicating the detected current position in association with the detected physical channel in the area map storage unit when there are fewer than two positions among the positions indicated by the positional information included in the coverage area information of the detected physical channel within the range of the distance indicated by the defined threshold value from the detected current position and the positions on the boundary of the coverage area of the detected channel at the distance indicated by the defined threshold value from the detected current position; and
- a process of generating, when there are two or more positions among the positions indicated by the unlinked-position information associated with the detected physical channel within the range of the distance indicated by the defined threshold value from the detected current position and the positions located on a line joining positions indicated by the unlinked-position information associated with the detected physical channel at the distance indicated by the defined threshold value from the detected current position, coverage area information including positional information indicating the detected current position and either or both of the positions indicated by the unlinked-position information associated with the detected physical channel within the range of the distance indicated by the defined threshold value from the detected current position and the positions located on a line joining positions indicated by the unlinked-position information associated with the detected physical channel at the distance indicated by the defined threshold value from the detected current position.

6. The digital broadcasting reception apparatus of claim 3 wherein, when the coverage area indicated by the generated coverage area information touches or overlaps a coverage area indicated by the coverage area information stored in the area map storage unit, the area map generating unit updates the coverage area information stored in the area map storage unit to indicate a new coverage area that merges the coverage area indicated by the generated coverage area information with the coverage area indicated by the coverage area information stored in the area map storage unit.

7. The digital broadcasting reception apparatus of claim 1, wherein:
- the area map storage unit further stores, for each physical channel used by a broadcast station, either or both of relay station information indicating a physical channel of a relay station of the broadcast station and affiliated station information indicating a physical channel of an affiliated station of the broadcast station; and
- when the reception state of a signal on the physical channel selected by the tuning control unit deteriorates, the channel scan control unit refers to either or both of the relay station information and the affiliated station information, identifies physical channels of relay and/or station affiliated stations of the selected physical channel, selects from among the identified physical channels, according to the coverage area information, a physical channel the coverage area of which includes the current position detected by the current position detection unit, and detects whether or not its broadcast signal can be received by the reception unit.

8. The digital broadcasting reception apparatus of claim 1, wherein:
- the area map storage unit further stores, for each physical channel used by a broadcast station, either or both of relay station information indicating a physical channel of a relay station of the broadcast station and affiliated station information indicating a physical channel of an affiliated station of the broadcast station; and
- when the channel scan control unit determines that the current position detected by the current position detection unit is in a vicinity of a boundary of the coverage area of the physical channel selected by the tuning control unit and, from a history of current positions detected by the current position detection unit, determines that the digital broadcasting reception apparatus is headed out of the coverage area of the physical channel selected by the tuning control unit, the channel scan control unit refers to either or both of the relay station information and the affiliated station information, identifies physical channels of relay and/or station affiliated stations of the selected physical channel, and detects whether or not the broadcast signal can be received on one of the identified physical channels by the reception unit.

9. The digital broadcasting reception apparatus of claim 7, wherein, when the channel scan control unit detects that the broadcast signal can be received on the physical channel of the relay station or the affiliated station, the tuning control unit selects the physical channel and causes the reception unit to receive the signal on the selected physical channel.

10. The digital broadcasting reception apparatus of claim 1, wherein the reception unit comprises:
- a first reception unit for receiving the signal on the physical channel selected by the tuning control unit; and
- a second reception unit controlled by the channel scan control unit.

11. The digital broadcasting reception apparatus of claim 1, wherein the coverage area information sequentially stores the positional information in a sequence that follows the boundary of the coverage area in one direction.

12. The digital broadcasting reception apparatus of claim 11, wherein, when a total sum of the angles between line segments between the current position detected by the current position detection unit and positions indicated by the positional information included in the coverage area information that are mutually adjacent in the sequence is 360 degrees, the tuning control unit determines that the current position detected by the current position detection unit is included in the coverage area indicated by the coverage area information.

13. The digital broadcasting reception apparatus of claim 12, wherein the tuning control unit sums the angles between the line segments as positive values when the line segment in the following position in the sequence is located in the one direction from the line segment in the preceding position in the sequence, and as negative values when the line segment in the following position in the sequence is located in a direction opposite to the one direction from the line segment in the preceding position in the sequence.

14. The digital broadcasting reception apparatus of claim 11, wherein the tuning control unit identifies two positions indicated by the positional information included in the coverage area information by following the sequence, generates a first vector between the identified positions and a second vector from the current position detected by the current position detection unit to an origin position of the first vector, and, from the sign of an outer product of the first and second vectors, determines whether or not the current position detected by the current position detection unit is included in the coverage area indicated by the coverage area information.

15. The digital broadcasting reception apparatus of claim 1, wherein for each boundary of the coverage area, the tuning control unit determines in advance which side of the boundary is inside the coverage area, and determines whether or not the current position detected by the current position detection unit is included in the coverage area by determining on which side of the boundary the current position detected by the current position detection unit is located.

16. The digital broadcasting reception apparatus of claim 1, wherein the area map generating unit detects closely adjacent positions from among the positions indicated by the positional information included in the coverage area information and carries out processing for merging the detected positions.

17. The digital broadcasting reception apparatus of claim 1, wherein the area map generating unit detects closely adjacent boundaries from boundaries between the positions indicated by the positional information included in the coverage area information, and carries out processing for merging the detected boundaries.

18. A digital broadcasting reception method comprising:
a reception step for receiving a signal from a physical channel;
a signal strength detection step for detecting the received strength of the signal received in the reception step;
a channel scan control step for detecting a physical channel from which a broadcast signal can be received in the reception step;
a current position detection step for detecting a current position;
a determination step for determining whether or not the current position detected by the current position detection step is included in a coverage area of the detected physical channel when the channel scan control step has detected a physical channel from which the broadcast signal can be received in the reception step, on the basis of coverage area information defining the coverage area by means of bounding positions indicated by positional information, including three or more items of positional information indicating positions at which the broadcast signal can be received;
a threshold value specification step for defining a threshold value indicating a distance that increases with increasing received strength detected in the signal strength detection step, when the detected current position is not included in the coverage area of the detected physical channel;
a linked-position selection step for selecting as linked positions, on a basis of the coverage area information, two positions among the positions included in the coverage area of the detected physical channel within a range of the distance indicated by the defined threshold value from the detected current position; and
an area map generating step for carrying out a process that enlarges the coverage area to lines linking the linked positions and the detected current position by adding positional information indicating the detected current position to the coverage area information of the detected physical channel.

* * * * *